United States Patent
Gunnam et al.

(10) Patent No.: US 8,464,142 B2
(45) Date of Patent: Jun. 11, 2013

(54) ERROR-CORRECTION DECODER EMPLOYING EXTRINSIC MESSAGE AVERAGING

(75) Inventors: Kiran Gunnam, San Jose, CA (US); Shaohua Yang, San Jose, CA (US); Changyou Xu, Fremont, CA (US)

(73) Assignee: LSI Corporation, San Jose, CA (US)

( * ) Notice: Subject to any disclaimer, the term of this patent is extended or adjusted under 35 U.S.C. 154(b) by 458 days.

(21) Appl. No.: 12/766,038

(22) Filed: Apr. 23, 2010

(65) Prior Publication Data
US 2011/0264979 A1     Oct. 27, 2011

(51) Int. Cl.
*H03M 13/03*     (2006.01)
(52) U.S. Cl.
USPC .......................................... 714/786; 714/781
(58) Field of Classification Search
USPC ................................................ 714/781, 786
See application file for complete search history.

(56) References Cited

U.S. PATENT DOCUMENTS

| | | | |
|---|---|---|---|
| 3,755,779 A | 8/1973 | Price | |
| 4,295,218 A | 10/1981 | Tanner | |
| 5,048,060 A | 9/1991 | Arai et al. | |
| 5,721,745 A | 2/1998 | Hladik et al. | |
| 5,734,962 A | 3/1998 | Hladik et al. | |
| 6,023,783 A | 2/2000 | Divsalar et al. | |
| 6,236,686 B1 | 5/2001 | Kamishima | |
| 6,307,901 B1 | 10/2001 | Yu et al. | |
| 6,550,023 B1 | 4/2003 | Brauch et al. | |
| 6,678,843 B2 | 1/2004 | Giulietti et al. | |
| 6,745,157 B1 | 6/2004 | Weiss et al. | |
| 6,760,879 B2 | 7/2004 | Giese et al. | |
| 6,888,897 B1 | 5/2005 | Nazari et al. | |
| 6,910,000 B1 | 6/2005 | Yedidia et al. | |

(Continued)

FOREIGN PATENT DOCUMENTS

| JP | 2007036495 A | 11/2007 |
|---|---|---|
| JP | 2009100222 A | 5/2009 |

(Continued)

OTHER PUBLICATIONS

K. Gunnam et al., "Value-Reuse Properties of Min-Sum for GF(q)" (dated Oct. 2006) Dept. of ECE, Texas A&M University Technical Note, published about Aug. 2010.

(Continued)

*Primary Examiner* — Charles Ehne
(74) *Attorney, Agent, or Firm* — Mendelsohn, Drucker & Associates, P.C.; Craig M. Brown; Steve Mendelsohn

(57) ABSTRACT

In one embodiment, an LDPC decoder has a controller and an extrinsic log-likelihood (LLR) value generator. The extrinsic LLR value generator is selectively configurable to operate in either (i) a non-averaging mode that updates extrinsic LLR values without averaging or (ii) an averaging mode that updates extrinsic LLR values using averaging. Initially, the extrinsic LLR value generator is configured to generate non-averaged extrinsic LLR values, and the decoder attempts to recover an LDPC-encoded codeword using the non-averaged extrinsic LLR values. If the decoder is unable to recover the correct codeword, then (i) the controller selects the averaging mode, (ii) the extrinsic LLR value generator is configured to generate average extrinsic LLR values, and (iii) the decoder attempts to recover the correct codeword using the average extrinsic LLR values. Averaging the extrinsic LLR values may slow down the propagation of erroneous messages that lead the decoder to convergence on trapping sets.

20 Claims, 6 Drawing Sheets

U.S. PATENT DOCUMENTS

| | | | |
|---|---|---|---|
| 7,143,333 B2 | 11/2006 | Blankenship et al. | |
| 7,181,676 B2 | 2/2007 | Hocevar | |
| 7,219,288 B2 | 5/2007 | Dielissen et al. | |
| 7,237,181 B2 | 6/2007 | Richardson | |
| 7,251,769 B2* | 7/2007 | Ashikhmin et al. | 714/755 |
| 7,296,216 B2 | 11/2007 | Shen et al. | |
| 7,340,671 B2 | 3/2008 | Jones et al. | |
| 7,353,444 B2 | 4/2008 | Owsley et al. | |
| 7,457,367 B2* | 11/2008 | Farhang-Boroujeny et al. | 375/262 |
| 7,689,888 B2 | 3/2010 | Kan et al. | |
| 7,725,800 B2 | 5/2010 | Yang et al. | |
| 7,730,377 B2 | 6/2010 | Hocevar | |
| 7,739,558 B1 | 6/2010 | Farjadrad et al. | |
| 7,752,523 B1 | 7/2010 | Chaichanavong et al. | |
| 7,770,090 B1 | 8/2010 | Kons et al. | |
| 7,805,642 B1 | 9/2010 | Farjadrad | |
| 7,895,500 B2 | 2/2011 | Sun et al. | |
| 7,904,793 B2 | 3/2011 | Mokhlesi et al. | |
| 7,941,737 B2 | 5/2011 | Gopalakrishnan et al. | |
| 7,949,927 B2 | 5/2011 | Park et al. | |
| 8,010,869 B2 | 8/2011 | Wejn et al. | |
| 8,020,070 B2 | 9/2011 | Langner et al. | |
| 8,037,394 B2 | 10/2011 | Djurdjevic et al. | |
| 8,046,658 B2 | 10/2011 | Heinrich et al. | |
| 8,051,363 B1 | 11/2011 | Liu | |
| 8,103,931 B2 | 1/2012 | Wang et al. | |
| 8,127,209 B1 | 2/2012 | Zhang et al. | |
| 8,151,171 B2 | 4/2012 | Blanksby | |
| 8,156,409 B2 | 4/2012 | Patapoutian et al. | |
| 8,616,345 | 4/2012 | Graef | |
| 8,171,367 B2 | 5/2012 | Gao et al. | |
| 8,205,134 B2 | 6/2012 | Harrison et al. | |
| 8,205,144 B1 | 6/2012 | Yadav | |
| 8,214,719 B1 | 7/2012 | Sheng et al. | |
| 8,219,878 B1 | 7/2012 | Varnica et al. | |
| 8,255,763 B1 | 8/2012 | Yang et al. | |
| 8,301,984 B1 | 10/2012 | Zhang et al. | |
| 2002/0062468 A1 | 5/2002 | Nagase et al. | |
| 2002/0166095 A1 | 11/2002 | Lavi et al. | |
| 2005/0132260 A1 | 6/2005 | Kyung et al. | |
| 2005/0193320 A1 | 9/2005 | Varnica et al. | |
| 2005/0204255 A1 | 9/2005 | Yeh et al. | |
| 2005/0210367 A1* | 9/2005 | Ashikhmin et al. | 714/801 |
| 2005/0283707 A1 | 12/2005 | Sharon et al. | |
| 2006/0013306 A1 | 1/2006 | Kim et al. | |
| 2006/0036928 A1 | 2/2006 | Eroz et al. | |
| 2006/0107181 A1 | 5/2006 | Dave et al. | |
| 2006/0115802 A1 | 6/2006 | Reynolds | |
| 2006/0285852 A1 | 12/2006 | Xi et al. | |
| 2007/0011569 A1 | 1/2007 | Vila Casado et al. | |
| 2007/0011573 A1 | 1/2007 | Farjadrad et al. | |
| 2007/0011586 A1 | 1/2007 | Belogolovyi et al. | |
| 2007/0044006 A1 | 2/2007 | Yang et al. | |
| 2007/0071009 A1 | 3/2007 | Nagaraj et al. | |
| 2007/0089018 A1 | 4/2007 | Tang et al. | |
| 2007/0089019 A1 | 4/2007 | Tang et al. | |
| 2007/0124652 A1 | 5/2007 | Litsyn et al. | |
| 2007/0147481 A1 | 6/2007 | Bottomley et al. | |
| 2007/0153943 A1 | 7/2007 | Nissila | |
| 2007/0162788 A1 | 7/2007 | Moelker | |
| 2007/0220408 A1 | 9/2007 | Huggett et al. | |
| 2007/0234178 A1 | 10/2007 | Richardson et al. | |
| 2007/0234184 A1 | 10/2007 | Richardson | |
| 2008/0049869 A1 | 2/2008 | Heinrich et al. | |
| 2008/0082868 A1 | 4/2008 | Tran et al. | |
| 2008/0104485 A1 | 5/2008 | Lyakh et al. | |
| 2008/0109701 A1 | 5/2008 | Yu et al. | |
| 2008/0126910 A1 | 5/2008 | Venkatesan et al. | |
| 2008/0148129 A1 | 6/2008 | Moon | |
| 2008/0163032 A1 | 7/2008 | Lastras-Montano | |
| 2008/0235561 A1 | 9/2008 | Yang | |
| 2008/0276156 A1 | 11/2008 | Gunnam et al. | |
| 2008/0301517 A1 | 12/2008 | Zhong | |
| 2008/0301521 A1 | 12/2008 | Gunnam et al. | |
| 2009/0063931 A1 | 3/2009 | Rovini et al. | |
| 2009/0083609 A1 | 3/2009 | Yue et al. | |
| 2009/0132897 A1 | 5/2009 | Xu et al. | |
| 2009/0150745 A1 | 6/2009 | Langner et al. | |
| 2009/0235146 A1 | 9/2009 | Tan et al. | |
| 2009/0259912 A1* | 10/2009 | Djordjevic et al. | 714/752 |
| 2009/0273492 A1 | 11/2009 | Yang et al. | |
| 2009/0307566 A1 | 12/2009 | No et al. | |
| 2009/0319860 A1 | 12/2009 | Sharon et al. | |
| 2010/0037121 A1 | 2/2010 | Jin et al. | |
| 2010/0042806 A1 | 2/2010 | Gunnam | |
| 2010/0042890 A1 | 2/2010 | Gunnam | |
| 2010/0042905 A1* | 2/2010 | Gunnam et al. | 714/780 |
| 2010/0042906 A1* | 2/2010 | Gunnam et al. | 714/780 |
| 2010/0050043 A1 | 2/2010 | Savin | |
| 2010/0058152 A1* | 3/2010 | Harada | 714/795 |
| 2010/0088575 A1 | 4/2010 | Sharon et al. | |
| 2011/0041029 A1 | 2/2011 | Yedidia et al. | |
| 2012/0135285 A1 | 5/2012 | Iwama et al. | |
| 2012/0139074 A1 | 6/2012 | Abe | |

FOREIGN PATENT DOCUMENTS

| | | |
|---|---|---|
| WO | WO03092170 A1 | 11/2003 |
| WO | WO2004079563 A1 | 9/2004 |
| WO | WO2007114724 A1 | 10/2007 |
| WO | WO2008004215 A2 | 1/2008 |
| WO | WO 2010/019168 A1 | 2/2010 |

OTHER PUBLICATIONS

K. Gunnam et al., "Value-Reuse Properties of Min-Sum for GF (q)" (dated Jul. 2008) Dept. of ECE, Texas A&M University Technical Note, published about Aug. 2010.

K. Gunnam "Area and Energy Efficient VLSI Architectures for Low-Density Parity-Check Decoders Using an On-The-Fly Computation" dissertation at Texas A&M University, Dec. 2006.

Kiran Gunnam, Gwan Choi, Mark Yeary—"An LDPC decoding schedule for memory access reduction", IEEE International Conference on Acoustics, Speech, and Signal Processing (ICASSP) 2004, pp. 173-176, vol.15.

Stefan Landner, Olgica Milenkovic—"Algorithmic and Combinatorial Analysis of Trapping Sets in Structured LDPC Codes", International Conference on Wireless Networks, Communications and Mobile Computing, 2005, pp. 630-635, vol.1.

Hao Zhong,Tong Zhang—"Block—LDPC: A Practical LDPC Coding System Design Approach", IEEE transactions on circuits and systems—I: Regular Papers, Apr. 2005, pp. 766-775, vol.52.

Kiran K. Gunnam, Gwan S. Choi, Weihuang Wang, Euncheol Kim, and Mark B. Yeary—"Decoding of Quasi-cyclic LDPC Codes Using an On-the-Fly Computation", Fortieth Asilomar Conference on Signals, Systems and Computers (ACSSC), 2006, pp. 1192-1199.

Thomas J. Richardson and Rudiger L. Urbanke—"Efficient Encoding of Low-Density Parity-Check Codes", IEEE Transactions on Information Theory, Feb. 2001,pp. 638-656,vol.47, No. 2.

Tom Richardson—"Error Floors of LDPC Codes", IEEE Transactions on Information Theory, Feb. 2001, pp. 1426-1435,vol.47, No. 2.

E. Papagiannis, C. Tjhai, M. Ahmed, M. Ambroze, M. Tomlinson—"Improved Iterative Decoding for Perpendicular Magnetic Recording", The ISCTA 2005 Conference on Feb. 4, 2005,pp. 1-4.

Kiran K. Gunnam, Gwan S. Choi, and Mark B. Yeary—"A Parallel VLSI Architecture for Layered Decoding for Array LDPC Codes", 20th International Conference on VLSI Design, 2007,6th International Conference on Embedded Systems, Jan. 2007 pp. 738-743.

David J.C. Mackay—"Information Theory, Inference, and Learning Algorithms", Cambridge University Press Sep.2003, p. 640.

R. Michael Tanner, Deepak Sridhara, Arvind Sridharan, Thomas E. Fuja, and Daniel J. Costello, Jr—"LDPC Block and Convolutional Codes Based on Circulant Matrices", IEEE Transactions on Information Theory, Dec. 2004, pp. 2966-2984, vol.50, No. 12.

Amin Shokrollahi—"LDPC Codes: An Introduction, in coding, Cryptography and Compinatorics",Computer Science and Applied Logic, Birkhauser, Basel, 2004, pp. 85-110, vol.23.

Yang Han and William E. Ryan—"LDPC Decoder Strategies for Achieving Low Error Floors", Proceedings of Information Theory and Applications Workshop, San Diego, CA, Jan. 2008, pp. 1-10.

Mohammad M. Mansour and Naresh R. Shanbhag—"Low Power VLSI decoder architectures for LDPC codes"International Symposium on Low Power Electronics and Design Proceedings of the 2002, ICIMS Research Center, 2002, pp. 284-289.
Dale E. Hocevar—"A Reduced Complexity Decoder Architecture Via Layered Decoding of LDPC Codes", IEEE Workshop on Signal Processing Systems, 2004, pp. 107-112.
Robert G. Gallager—"Low Density Parity—Check Codes",Cambridge Mass Jul. 1963,p. 90.
T. Richardson and R. Urbanke—"Modern Coding Theory", Cambridge University Press, Preliminary version—Oct. 18, 2007, p. 590.
Kiran Gunnam, Gwan Choi, Weihuang Wang, Mark Yeary—"Multi-Rate Layered Decoder Architecture for Block LDPC Codes of the IEEE 802, 11n Wireless Standard", IEEE International Symposium on Circuits and Systems (ISCAS) 2007, pp. 1645-1648.
Kiran K. Gunnam, Gwan S. Choi, Mark B. Yeary, Shaohua Yang and Yuanxing Lee—"Next Generation Iterative LDPC Solutions for Magnetic Recording Storage", 42nd Asilomar Conference on Signals, Systems and Computers, 2008, pp. 1148-1152.
D.J.C. Mackay and R.M. Neal—"Near Shannon limit performance of low density parity check codes", Electronics Letters Mar. 13, 1997, pp. 458-459, vol.33 No.6.
Jinghu Chen, Ajay Dholakia, Evangelos Eleftheriou, Marc P. C. Fossorier, Xiao-Yu Hu,"Reduced-Complexity Decoding of LDPC Codes", IEEE Transactions on Communications, Aug. 2005, pp. 1288-1299,vol.53, No.8.
Kiran K. Gunnam, Gwan S. Choi, Mark B. Yeary and Mohammed Atiquzzaman—"VLSI Architectures for Layered Decoding for Irregular LDPC Codes of WiMax", IEEE International Conference on Communications (ICC), 2007, pp. 4542-4547.
Andrew J. Blanksby and Chris J. Howland—"A 690-mW 1-Gb/s 1024-b, Rate-1/2 Low-Density Parity-Check Code Decoder", IEEE Journal of Solid-State Circuits, Mar. 2002.pp. 404-412,vol.37, No.3.
Kiran Gunnam, Weihuang Wang, Gwan Choi, Mark Yeary—"VLSI Architectures for Turbo Decoding Message Passing Using Min-Sum for Rate-Compatible Array LDPC Codes", 2nd International Symposium on Wireless Pervasive Computing (ISWPC), 2007, pp. 561-566.
Kiran K. Gunnam, Gwan S. Choi, Weihuang Wang, and Mark B. Yeary—"A Parallel VLSI Architecture for Layered Decoding",Proceedings of the 20th International Conference on VLSI Design, 6th International Conference: Embedded Systems, 2007, pp. 738-743.
R.Michael Tanner—"A Recursive Approach to Low Complexity Codes",IEEE transaction on Information Theory, Sep.1981,pp. 533-547,vol.IT-27, No. 5.
Mohammad M. Mansour, and Naresh R. Shanbhag —"A 640-Mb/s 2048-Bit Programmable LDPC Decoder Chip", IEEE Journal of Solid-State Circuits, Mar. 2006, pp. 684-698,vol.41, No.3.
Badri N. Vellambi R, and Faramarz Fekri, "An Improved Decoding Algorithm for Low-Density Parity-Check Codes over the Binary Erasure Channel", IEEE Globecom 2005 proceedings, pp. 1182-1186.
Yang Han, William E. Ryan—"Low-Floor Decoders for LDPC Codes", IEEE Transactions on Communications, vol.57, No. 6, Jun. 2009, pp. 1663-1673.
PCT International Search Report dated Feb. 9, 2009 from International Application No. PCT/US 08/86537.
PCT International Search Report dated May 15, 2009 from International Application No. PCT/US 09/39279.
PCT International Search Report dated Feb. 12, 2009 from International Application No. PCT/US 08/86523.
PCT International Search Report dated May 28, 2009 from International Application No. PCT/US 09/41215.
PCT International Search Report dated May 15, 2009 from International Application No. PCT/US 09/39918.
Vila Casado, Andres I., Weng, Wen-Yen and Wesel, Richard D. "Multiple Rate Low-Density Parity-Check Codes with Constant Blocklength," IEEE 2004, pp. 2010-2014.
Vila Casado, Andres I. "Variable-rate Low-denisty Parity-check Codes with Constant Blocklength," UCLA Technologies Available for Licensing Copyright © 2009 The Regents of the University of California. http://www.research.ucla.edu/tech/ucla05-074.htm (2 pages).
Vila Casado, Andres I., Weng, Wen-Yen, Valle, Stefano and Wesel, Richard D. "Multiple-Rate Low-Density Parity-Check Codes with Constant Blocklength," IEEE Transactions on Communications, vol. 57, No. 1, Jan. 2009; pp. 75-83.
Tuchler, M., et al., "Improved Receivers for Digital High Frequency Waveforms Using Turbo Equalization," Military Communications Conference; Milcom 2002 Proceedings; Anaheim, CA, Oct. 7-10, 2002; IEEE Military Communications Conference, New York, NY; IEEE; US, vol. 1, Oct. 7, 2002; pp. 99-104; XP002966498.
Alghonaim, E., et al., "Improving BER Performance of LDPC codes Based on Intermediate Decoding Results," Signal Processing and Communications; 2007; ICSPC, 2007; IEEE International Conference; IEEE; Piscataway, NJ; USA; Nov. 24, 2007; pp. 1547-1550; XP031380831.
Cavus et al., "A Performance Improvement and Error Floor Avoidance Technique for Belief Propagation Decoding of LDPC Codes," IEEE 16th International Symposium, Personal, Indoor & Mobile Radio Communications (PIMRC), Berlin, Germany Sep. 11-14, 2005, pp. 2386-2390.
Cavus, Enver et al., "An IS Simulation Technique for Very Low BER Performance Evaluation of LDPC Codes," IEEE International Conference on Communications, Jun. 1, 2006, pp. 1095-1100.
Cole, Chad A. and Hall, Eric K., "Analysis and Design of Moderate Length Regular LDPC Codes with Low Error Floors," Proc, 40th Conf. Information Sciences and Systems, Princeton, NJ, 2006, 6 pgs.
Richardson, Tom, "Error Floors of LDPC Codes," Allerton Conf. on Communication, Control and Computing, (Monticello, Illinois), Oct. 2003, pp. 1426-1435.
Gunnam, Kiran K., Choi, Gwan S., and Yeary, Mark B., "Technical Note on Iterative LDPC Solutions for Turbo Equalization," Texas A&M Technical Note, Department of ECE, Texas A&M University, College Station, TX 77843, Jul. 2006 (available online at http://dropzone.tamu.edu), pp. 1-5.
Sripimanwat, K., "Turbo Code Applications: A Journey From a Paper to Realization", Oct. 26, 2005, Springer, p. 27.
Pusane, A.E.; Costello, D.J.; Mitchell, D.G.M;, "Trapping Set Analysis of Protograph-Based LDPC Convolutional Codes," Information Theory, 2009. ISIT 2009. IEEE International Symposium on, vol., No., pp. 561-565, Jun. 28, 2009-Jul. 3, 2009.
Laendner, S.; Milenkovic, 0.;, "LDPC Codes Based on Latin Squares: Cycle Structure, Stopping Set, and Trapping Set Analysis," Communications, IEEE Transactions on, vol. 55, No. 2, pp. 303-312, Feb. 2007.
Dehkordi, M.K,; Banihashemi, A.H.;, "An Efficient Algorithm for Finding Dominant Trapping Sets of LDPC Codes," Turbo Codes and Iterative Information Processing (ISTC), 2010 6th International Symposium on, pp. 444-448, Sep. 6-10, 2010.
C. A. Cole, S. G. Wilson, E. K. Hall and T. R. Giallorenzi, "A General Method for Finding Low Error Rates of LDPC Codes," http://arxiv.org/abs/cs.IT/0605051.
D. MacKay and M. Postol, "Weaknesses of margulis and ramanujan-margulis low- density parity-check codes," Electronic Notes in Theoretical Computer Science, vol. 74, 2003.
B. Xia and W. E. Ryan, "On importance sampling for linear block codes," Proc. 2003 IEEE International Conference on Communications, vol. 4, pp. 2904-2908, May 2003.
L. Dolecek, Z. Zhang, M. Wainwright, V. Anantharam, and B. Nikoli'c, "Evaluation of the low frame error rate performance of LDPC codes using importance sampling," 2007 IEEE Inform. Theory Workshop, Sep. 2-6, 2007.
Casado, V., et al., "Informed Dynamic Scheduling for Belief-Propagation Decoding of LDPC Codes," IEEE International Conference on Communications, Jun. 24-28, 2007, pp. 932-937.
Presman, N., et al., "Efficient Layers-based Schedules for Iterative Decoding of LDPC Codes," IEEE International Symposium on Information Theory, Jul. 6-11, 2008, pp. 1148-1152.
Radosavljevic, P., et al., "Optimized Message Passing Schedules for LDPC Decoding," Conference Record of the Thirty-Ninth Asilomar conference on Signals, Systems and Computers, Oct. 28-Nov. 1, 2005, pp. 591-595.

Zheng, H., et al., "MMSE-Based Design of Scaled and Offset BP-Based Decoding Algorithms on the Fast Rayleigh Fading Channel," IEEE International Symposium on Circuits and Systems, May 24, 2006, pp. 2061-2064.

Sakai, R., et al., "Reduced Complexity Decoding Based on Approximation of Update Function for Low-Density Parity-Check Codes," Transactions of the Institute of Electronics, Information and Communication Engineers, Feb. 1, 2007, vol. J90-A, No. 2, pp. 83-91.

* cited by examiner $$H = \begin{pmatrix} B_{1,1} & B_{1,2} & B_{1,3} & B_{1,4} & B_{1,5} & B_{1,6} & B_{1,7} & B_{1,8} & B_{1,9} & B_{1,10} \\ B_{2,1} & B_{2,2} & B_{2,3} & B_{2,4} & B_{2,5} & B_{2,6} & B_{2,7} & B_{2,8} & B_{2,9} & B_{2,10} \\ B_{3,1} & B_{3,2} & B_{3,3} & B_{3,4} & B_{3,5} & B_{3,6} & B_{3,7} & B_{3,8} & B_{3,9} & B_{3,10} \\ B_{4,1} & B_{4,2} & B_{4,3} & B_{4,4} & B_{4,5} & B_{4,6} & B_{4,7} & B_{4,8} & B_{4,9} & B_{4,10} \end{pmatrix} \begin{matrix} \Big\} r=4 \end{matrix}$$

ERROR-CORRECTION DECODER EMPLOYING EXTRINSIC MESSAGE AVERAGING

CROSS-REFERENCE TO RELATED APPLICATIONS

The subject matter of this application is related to:
U.S. patent application Ser. No. 12/113,729 filed May 1, 2008,
U.S. patent application Ser. No. 12/113,755 filed May 1, 2008,
U.S. patent application Ser. No. 12/323,626 filed Nov. 26, 2008,
U.S. patent application Ser. No. 12/401,116 filed Mar. 10, 2009,
U.S. patent application Ser. No. 12/675,981 filed on Mar. 2, 2010,
U.S. patent application Ser. No. 12/677,322 filed Mar. 10, 2010,
U.S. patent application Ser. No. 12/680,810 filed Mar. 30, 2010,
U.S. application Ser. No. 12/524,418 filed on Jul. 24, 2009,
U.S. patent application Ser. No. 12/420,535 filed Apr. 8, 2009,
U.S. patent application Ser. No. 12/475,786 filed Jun. 1, 2009,
U.S. patent application Ser. No. 12/260,608 filed on Oct. 29, 2008,
PCT patent application no. PCT/US09/41215 filed on Apr. 21, 2009,
U.S. patent application Ser. No. 12/427,786 filed on Apr. 22, 2009,
U.S. patent application Ser. No. 12/492,328 filed on Jun. 26, 2009,
U.S. patent application Ser. No. 12/492,346 filed on Jun. 26, 2009,
U.S. patent application Ser. No. 12/492,357 filed on Jun. 26, 2009,
U.S. patent application Ser. No. 12/492,374 filed on Jun. 26, 2009,
U.S. patent application Ser. No. 12/538,915 filed on Aug. 11, 2009,
U.S. patent application Ser. No. 12/540,078 filed on Aug. 12, 2009,
U.S. patent application Ser. No. 12/540,035 filed on Aug. 12, 2009,
U.S. patent application Ser. No. 12/540,002 filed on Aug. 12, 2009,
U.S. patent application Ser. No. 12/510,639 filed on Jul. 28, 2009,
U.S. patent application Ser. No. 12/524,418 filed on Jul. 24, 2009,
U.S. patent application Ser. No. 12/510,722 filed on Jul. 28, 2009,
U.S. patent application Ser. No. 12/510,667 filed on Jul. 28, 2009,
U.S. patent application Ser. No. 12/644,622 filed on Dec. 22, 2009, and
U.S. patent application Ser. No. 12/644,181 filed on Dec. 22, 2009,
the teachings of all of which are incorporated herein by reference in their entirety.

BACKGROUND OF THE INVENTION

1. Field of the Invention

The present invention relates to signal processing, and, in particular, to error-correction encoding and decoding techniques such as low-density parity-check (LDPC) encoding and decoding.

2. Description of the Related Art

In attempting to recover a correct low-density parity-check (LDPC)-encoded codeword, an LDPC decoder may encounter one or more trapping sets that prevent the decoder from properly decoding the codeword. Trapping sets, which represent subgraphs in a Tanner graph of an LDPC code, typically have a strong influence on error-floor characteristics of the LDPC code because a trapping set may force the decoder to converge to an incorrect result. To improve error-floor characteristics, an LDPC decoder may employ different techniques to, for example, (i) break dominant trapping sets (i.e., trapping sets typically having the most-significant influence on error-floor characteristics) and/or (ii) prevent the LDPC decoder from converging on such trapping sets.

SUMMARY OF THE INVENTION

In one embodiment, the present invention is an apparatus comprising an error-correction (EC) decoder for recovering an EC-encoded codeword. The EC decoder comprises an extrinsic value generator adapted to generate a current extrinsic value based on at least one check-node value, wherein the current extrinsic value corresponds to a bit (e.g., n) of the EC-encoded codeword. The extrinsic value generator is also adapted to generate a current average extrinsic value based on the current extrinsic value and at least one previous extrinsic value, wherein the current average extrinsic value and the at least one previous extrinsic value correspond to the bit of the EC-encoded codeword.

In another embodiment, the present invention is an EC decoder-implemented method for recovering an EC-encoded codeword. The method generates a current extrinsic value based on at least one check-node value (e.g., R), wherein the current extrinsic value corresponds to a bit (e.g., n) of the EC-encoded codeword. The method also generates a current average extrinsic value based on the current extrinsic value and at least one previous extrinsic value, wherein the current average extrinsic value and the at least one previous extrinsic value correspond to the bit of the EC-encoded codeword.

In yet another embodiment, the present invention is an apparatus comprising an EC decoder for recovering an EC-encoded codeword. The apparatus comprises a means for generating a current extrinsic value based on at least one check-node value (e.g., R), wherein the current extrinsic value corresponds to a bit (e.g., n) of the EC-encoded codeword. The apparatus also comprises a means for generating a current average extrinsic value based on the current extrinsic value and at least one previous extrinsic value, wherein the current average extrinsic value and the at least one previous extrinsic value correspond to the bit of the EC-encoded codeword.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

FIG. 1 shows one implementation of a parity-check matrix that may be used to implement a regular, quasi-cyclic (QC) low-density parity-check (LDPC) code;

DETAILED DESCRIPTION

Figure 2:
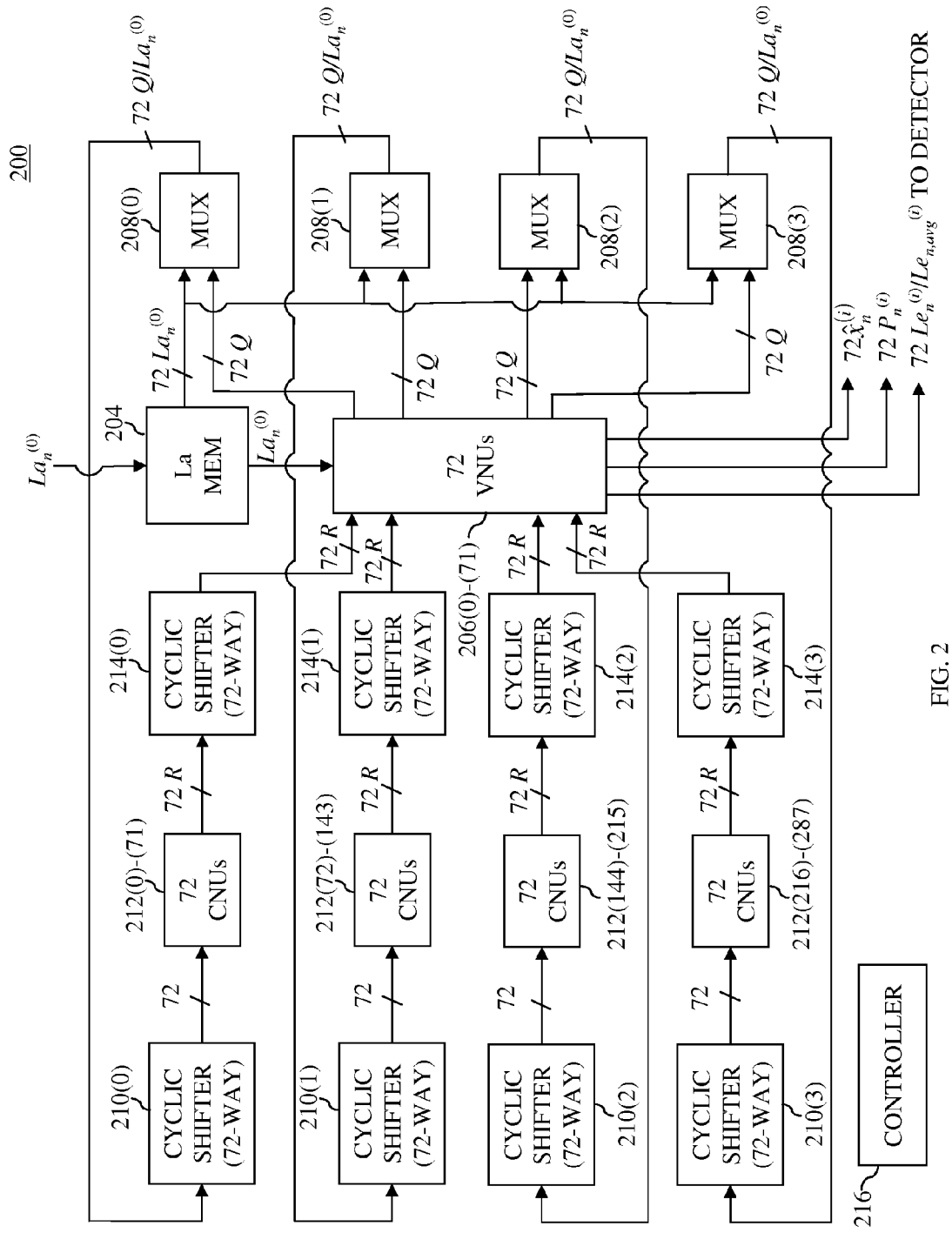
FIG. 2 shows a simplified block diagram of a non-layered LDPC decoder according to one embodiment of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

In attempting to recover a correct low-density parity-check (LDPC)-encoded codeword, an LDPC decoder might converge on a trapping set that prevents the decoder from correctly recovering the codeword. Convergence on a trapping set may be indicated by relatively sudden changes in the magnitudes of the messages that are updated by the LDPC decoder. Such sudden changes may be prevented by averaging messages over one or more iterations. Averaging may lower the error-floor by slowing down the propagation of erroneous information to and from trapping-set variables. One method of averaging, which involves averaging of variable-node messages (Q messages), is discussed in Ländner, "Algorithmic and Combinatorial Analysis of Trapping Sets in Structural LDPC Codes," 2005 International Conference on Wireless Networks, Communications, and Mobile Computing, Vol. 1, pgs. 630-635, the teachings of which are incorporated herein by reference in their entirety. Another method of averaging that involves averaging extrinsic log-likelihood (LLR) messages ($Le_n$) is presented herein.

FIG. 1 shows one implementation of a parity-check matrix 100 that may be used to implement a regular, quasi-cyclic (QC) LDPC code. Parity-check matrix 100, commonly referred to as an H-matrix, comprises 40 circulants $B_{j,k}$ that are arranged in r=4 rows of circulants (i.e., block rows) where j=1, . . . , r and c=10 columns of circulants (i.e., block columns) where k=1, . . . , c. A circulant is a sub-matrix that is either an identity matrix or is obtained by cyclically shifting an identity matrix, and a quasi-cyclic LDPC code is an LDPC code in which all of the sub-matrices are circulants. In H-matrix 100, each circulant $B_{j,k}$ is a p×p sub-matrix that may be obtained by cyclically shifting a single p×p identity matrix. For purposes of this discussion, assume that p=72 such that H-matrix 100 has p×r=72×4=288 total rows and p×c=72× 10=720 total columns Since each circulant $B_{j,k}$ is a permutation of an identity matrix, the hamming weight (i.e., the number of entries having a value of one) of each column in a circulant and the hamming weight of each row in a circulant are both equal to 1. Thus, the total hamming weight $w_r$ for each row of H-matrix 100 is equal to 1×c=1×10=10, and the total hamming weight $w_c$ for each column of H-matrix 100 is equal to 1×r=1×4=4. Each of the 288 rows of H-matrix 100 corresponds to an $m^{th}$ check node, where m ranges from 0, . . . , 287, and each of the 720 columns corresponds to an $n^{th}$ variable node (also referred to as a bit node), where n ranges from 0, . . . , 719. Further, each check node is connected to $w_r$=10 variable nodes as indicated by the is in a row, and each variable node is connected to $w_c$=4 check nodes as indicated by the is in a column. H-matrix 100 may be described as a regular LDPC code since all rows of H-matrix 100 have the same hamming weight $w_r$, and all columns of H-matrix 100 have the same hamming weight $w_c$.

Non-Layered LDPC Decoding

FIG. 2 shows a simplified block diagram of a non-layered LDPC decoder 200 according to one embodiment of the present invention. LDPC decoder 200, which may be used to recover codewords encoded using an H-matrix such as H-matrix 100 of FIG. 1, is selectively operable in either a non-averaging mode or an averaging mode. LDPC decoder 200 attempts to recover each LDPC-encoded codeword in the non-averaging mode. If decoder 200 fails to correctly recover an LDPC-encoded codeword while operating in the non-averaging mode, then decoder 200 is operated in the averaging mode to recover the LDPC-encoded codeword, where extrinsic messages $Le_n$ are averaged over two or more iterations of LDPC decoder 200 (as discussed below).

Initially, LDPC decoder 200 receives, from an upstream processor, 720 channel log-likelihood ratio (LLR) values $La_n^{(0)}$ for each codeword to be recovered, where each channel LLR value $La_n^{(0)}$ corresponds to one bit of the codeword. The upstream processor may perform, for example, radio-frequency processing, analog-to-digital conversion, equalization, channel detection such as Viterbi soft-output detection or maximum a posteriori (MAP) detection, or other processing suitable for generating soft-output values. The processing performed by the upstream processor may depend on the particular application in which LDPC decoder 200 is implemented. The channel LLR values $La_n^{(0)}$ are stored in La memory 204, and each codeword is decoded iteratively using a message-passing algorithm. For this discussion, suppose that each channel LLR value $La_n^{(0)}$ has five bits, including one hard-decision bit and a four-bit confidence value.

In general, LDPC decoder 200 decodes the 720 channel LLR values $La_n^{(0)}$ (i.e., messages) using a block-serial message-passing schedule. The messages are updated using (i) 288 check-node units (CNUs) 212, where each CNU 212 performs check-node updates for one row (i.e., the $m^{th}$ check node) of H-matrix 100 and (ii) 72 five-bit variable-node units (VNUs) 206, where each VNU 206 performs the variable-node updates for ten columns (i.e., the $n^{th}$ variable nodes) of H-matrix 100. CNUs 212(0)-(287) perform the check-node (i.e., row) updates for the 288 rows of H-matrix 100, one block column at a time, such that the check-node updates for the first block column (i.e., circulants $B_{1,1}$, $B_{2,1}$, $B_{3,1}$, and $B_{4,1}$) are performed, followed by the check-node updates for the second block column (i.e., circulants $B_{1,2}$, $B_{2,2}$, $B_{3,2}$, and $B_{4,2}$), followed by the check-node updates for the third block column (i.e., circulants $B_{1,3}$, $B_{2,3}$, $B_{3,3}$, and $B_{4,3}$), and so forth. VNUs 206(0)-(71) then perform the variable-node (i.e., column) updates for the 720 columns of H-matrix 100, one block column at a time, such that the variable-node updates for the first block column (i.e., circulants $B_{1,1}$, $B_{2,1}$, $B_{3,1}$, and $B_{4,1}$) are performed, followed by the variable-node updates for the second block column (i.e., circulants $B_{1,2}$, $B_{2,2}$, $B_{3,2}$, and $B_{4,2}$), followed by the variable-node updates for the third block column (i.e., circulants $B_{1,3}$, $B_{2,3}$, $B_{3,3}$, and $B_{4,3}$), and so forth. An iteration of LDPC decoder 200 (i.e., a local iteration) is complete after all check-node updates and variable-node updates have been performed.

Initially, in the non-averaging mode, the 720 channel LLR values $La_n^{(0)}$ are provided to four multiplexers 208(0)-(3) at a rate of 72 channel LLR values $La_n^{(0)}$ per clock cycle such that each multiplexer 208 receives all 72 channel LLR values $La_n^{(0)}$ in the set. Each multiplexer 208 may also receive 72 five-bit variable-node messages (herein referred to as Q messages) from VNUs 206(0)-(71), which messages are generated as discussed in further detail below. During the first iteration of LDPC decoder 200, multiplexers 208(0)-(3) select the sets of 72 channel LLR values $La_n^{(0)}$ that they receive to output to 72-way cyclic shifters 210(0)-(3), respectively. The initial Q messages, which are not selected, may be Q messages generated for a previously considered codeword. During subsequent iterations of LDPC decoder 200, multiplexers 208(0)-(3) select the sets of 72 Q messages that they receive from VNUs 206(0)-(71) to output to 72-way cyclic shifters 210(0)-(3), respectively. For the following discussion, it will be understood that any reference to Q messages, applies to soft values $La_n^{(0)}$ during the first iteration of LDPC decoder 200.

Cyclic shifters 210(0)-(3) cyclically shift the sets of 72 Q messages that they receive based on a cyclic-shift signal that may be received from, for example, controller 216. The cyclic-shift signal corresponds to cyclic-shift factors of the circulants of H-matrix 100 of FIG. 1. For example, during the first clock cycle of an iteration of LDPC decoder 200, cyclic shifters 210(0)-(3) may shift their respective sets of 72 Q messages based on the shift factors of circulants $B_{1,1}$, $B_{2,1}$, $B_{3,1}$, and $B_{4,1}$ of H-matrix 100 of FIG. 1, respectively. During the second clock cycle of an iteration of LDPC decoder 200, cyclic shifters 210(0)-(3) shift their respective sets of 72 five-bit Q messages based on the shift factors of circulants $B_{1,2}$, $B_{2,2}$, $B_{3,2}$, and $B_{4,2}$, respectively. Cyclic shifters 210(0)-(3) then provide their respective 72 cyclically-shifted Q messages to CNUs 212(0)-(287), such that each CNU 212 receives a different one of the Q messages.

Each CNU 212 (i) receives a number of Q messages equal to the hamming weight $w_r$ of a row of H-matrix 100 (e.g., 10) at a rate of one Q message per clock cycle and (ii) generates $w_r$ five-bit check-node messages (herein referred to as R messages). Each R message may be generated using a suitable check-node algorithm, such as the offset min-sum algorithm, characterized by Equations (1), (2), and (3) shown below:

$$R_{mn}^{(i)} = \delta_{mn}^{(i)} \max(\alpha \kappa_{mn}^{(i)} - \beta, 0) \quad (1)$$

$$\kappa_{mn}^{(i)} = |R_{mn}^{(i)}| = \min_{n' \in N(m)/n} |Q_{n'm}^{(i-1)}| \quad (2)$$

$$\delta_{mn}^{(i)} = \left( \prod_{n' \in N(m)/n} \text{sign}(Q_{n'm}^{(i-1)}) \right), \quad (3)$$

where (i) $R_{mn}^{(i)}$ represents the R message corresponding to $m^{th}$ check node (i.e., row) and the $n^{th}$ variable node (i.e., column) of H-matrix 100 of FIG. 1 for the $i^{th}$ iteration of LDPC decoder 200, (ii) $Q_{nm}^{(i-1)}$ represents the Q message corresponding to the $n^{th}$ variable node and the $m^{th}$ check node of H-matrix 100 for the $(i-1)^{th}$ iteration, (iii) $\alpha$ represents a scaling factor, which ranges from 0 to 1, (iv) $\beta$ represents an offset value, which ranges from 0 to 15 for five-bit messages, and (v) the function "sign" indicates that the multiplication operation (i.e., $\Pi$) is performed on the signs of the $Q_{nm}^{(i-1)}$ messages. Suppose that n' is a variable node in the set N(m)/n of all variable nodes connected to the $m^{th}$ check node except for the $n^{th}$ variable node (i.e., n'∈N(m)/n). The CNU 212 corresponding to the $m^{th}$ check node (i.e., row) generates message $R_{mn}^{(i)}$ based on all Q messages received during the previous $(i-1)^{th}$ iteration from the set N(m)/n. Thus, in the embodiment of FIG. 2, each R message is generated based on N(m)/n=nine Q messages (i.e., $w_r-1=10-1$). Note that, for the first iteration, channel LLR values $La_n^{(0)}$ received from soft-value memory 204 are used in Equations (2) and (3) in lieu of the Q messages for the prior iteration (i.e., $Q_{n'm}^{(0)} = La_{n'm}^{(0)}$).

Cyclic shifters 214(0)-(3) receive sets of 72 five-bit R messages from their respective CNUs 212 and cyclically shift the sets of 72 five-bit R messages according to the cyclic shifts of the circulants $B_{j,k}$ of H-matrix 100 of FIG. 1. Essentially, cyclic shifters 214(0)-(3) reverse the cyclic shifting of cyclic shifters 210(0)-(3). For example, if cyclic shifters 210(0)-(3) perform cyclic upshifting, then cyclic shifters 214(0)-(3) may perform cyclic downshifting.

During each of ten clock cycles, cyclic shifters 214(0)-(3) provide 4×72 cyclically-shifted five-bit R messages to VNUs 206(0)-(71), such that each VNU 206 receives a set of four of the R messages per clock cycle, one R message from each cyclic shifter 214. Each VNU 206 is selectively configurable to operate in either the non-averaging mode or the averaging mode. A detailed discussion of a VNU is provided below in relation to FIG. 4. In the non-averaging mode, for each set of four R messages received, each VNU 206 updates a set of four Q messages corresponding to bit n of the LDPC-encoded codeword as shown in Equation (4):

$$Q_{nm}^{(i)} = La_n^{(0)} + \sum_{m' \in M(n)/m} R_{m'n}^{(i-1)}, \quad (4)$$

where m' is a check node in the set M(n)/m of all check nodes connected to the $n^{th}$ variable node except the $m^{th}$ check node (i.e., m'∈M(n)/m). The $n^{th}$ variable node generates message $Q_{nm}^{(i)}$ based on (i) all R messages received during the previous $(i-1)^{th}$ iteration from the set M(n)/m and (ii) a channel LLR value $La_n^{(0)}$ received from La memory 204 that corresponds to the $n^{th}$ variable node. Each VNU 206, which may be implemented using adder circuits, outputs the four updated Q messages that it generates, such that a different one of the four messages is provided to a different corresponding MUX 208.

In addition to outputting four updated five-bit Q messages for each set of four R messages received, each VNU 206, in the non-averaging mode, outputs (i) a non-averaged extrinsic LLR value $Le_n^{(i)}$, (ii) a hard-decision output bit $\hat{x}_n^{(i)}$, and (iii) a $P_n^{(i)}$ message. Each non-averaged extrinsic LLR value $Le_n^{(i)}$ may be represented as shown in Equation (5):

$$Le_n^{(i)} = \sum_{m \in M(n)} R_{mn}^{(i)}, \quad (5)$$

where m is a check node in the set M(n) of all check nodes connected to the $n^{th}$ variable node (i.e., m∈M(n)). In non-layered decoder 200, an extrinsic value is the sum of all check node messages generated in an iteration that correspond to a bit n of the LDPC-encoded codeword (which also corresponds to a variable node or column of the H-matrix). In a layered decoder (discussed below), extrinsic values are updated during different sub-iterations based on different subsets of check node messages that correspond to the bit n.

After all of the sub-iterations of a particular iteration have been completed in a layered decoder, the extrinsic value will be identical to the corresponding extrinsic value in an analogous non-layered decoder and therefore also equal to the sum of those same check node messages corresponding to bit n. In both non-layered decoding and layered decoding, an extrinsic value is a value that is provided from the LDPC decoder to a channel detector such as a Viterbi soft-output detector or maximum a posteriori (MAP) detector. This is in contrast to Q messages and R messages, which are used only internally by the decoder. Typically, the extrinsic value is used by the detector to improve channel detection. For example, in Viterbi detection, extrinsic values are used to improve the branch-metric calculation of the Viterbi detector. Additionally, the channel detector might use the extrinsic values in the calculation of the channel LLR values $La_n^{(0)}$ output from the channel detector to the LDPC decoder.

Each $P_n^{(i)}$ message may be generated using Equation (6) as follows:

$$P_n^{(i)} = La_n^{(0)} + Le_n^{(i)}, \quad (6)$$

and each hard-decision bit $\hat{x}_n^{(i)}$ may be represented as shown in Equations (7) and (8) below:

$$\hat{x}_n^{(i)} = 0 \text{ if } P_n \geq 0 \quad (7)$$

$$\hat{x}_n^{(i)} = 1 \text{ if } P_n < 0. \quad (8)$$

A message $P_n^{(i)}$ is determined for each variable node by adding the extrinsic value from Equation (5) to the channel LLR value $La_n^{(0)}$ received from La memory 204 that corresponds to the $n^{th}$ variable node as shown in Equation (6). If $P_n^{(i)}$ is greater than or equal to zero, then the hard-decision bit $\hat{x}_n^{(i)}$ is equal to zero, as shown in Equation (7). If $P_n^{(i)}$ is less than zero, then the hard-decision bit $\hat{x}_n^{(i)}$ is equal to one, as shown in Equation (8). Each hard-decision bit $\hat{x}_n^{(i)}$ may be determined by taking the most-significant bit (MSB) of a message $P_n^{(i)}$. After a set of 720 hard-decision bits $\hat{x}_n^{(i)}$ is generated, LDPC decoder 200 performs further processing to determine whether LDPC decoder 200 has recovered a correct codeword or failed to recover a correct codeword. To further understand the operations of LDPC decoder 200, consider FIG. 3.

Figure 3:
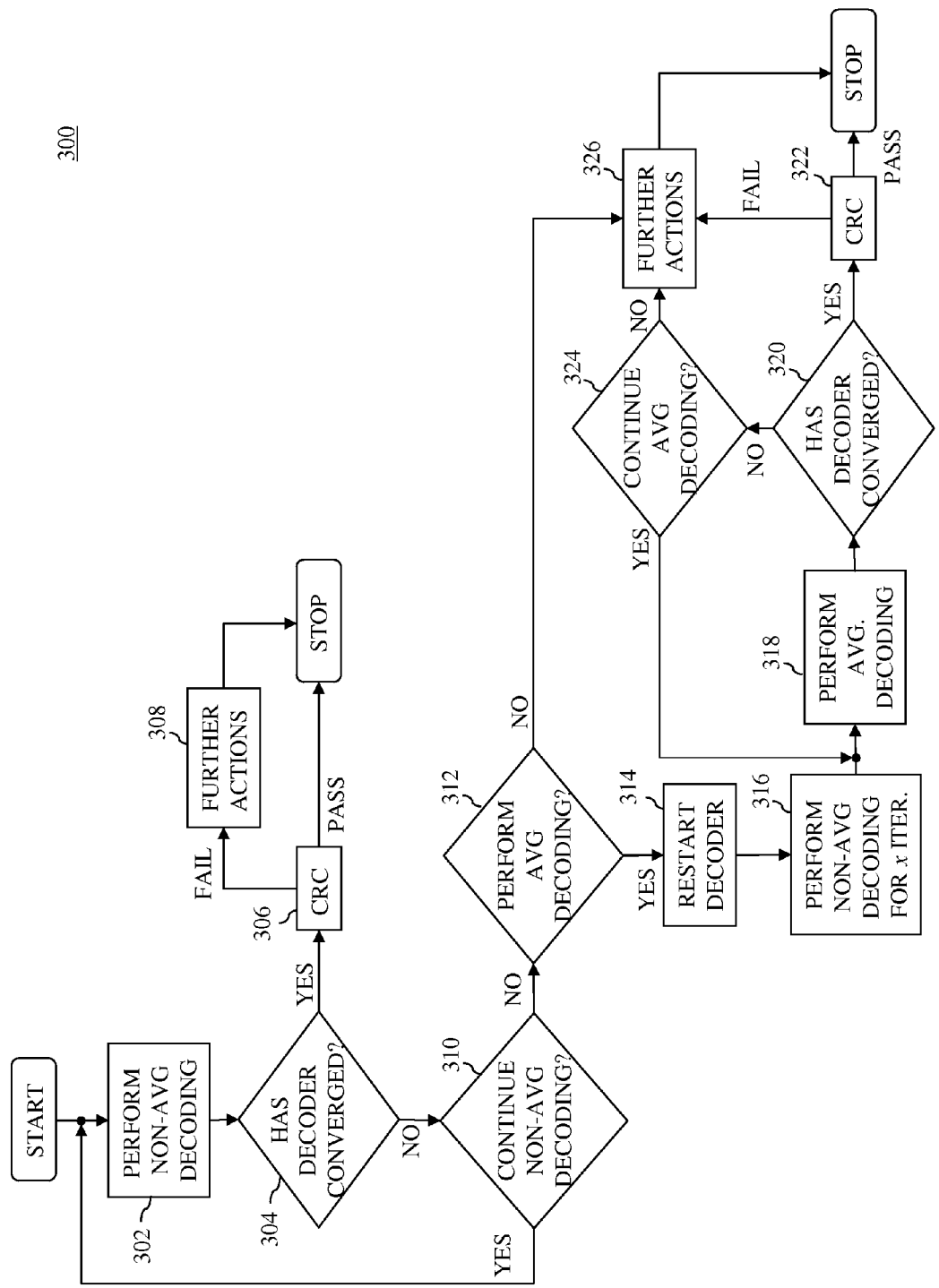
FIG. 3 shows a simplified flow diagram of processing performed by an LDPC decoder such as the LDPC decoder of FIG. 2 according to one embodiment of the present invention.

FIG. 3 shows a simplified flow diagram 300 of processing performed by an LDPC decoder such as LDPC decoder 200 according to one embodiment of the present invention. After startup, LDPC decoder 200 performs an initial decoding iteration (action 302) in the non-averaging mode as described above. Next, decision 304 is performed to determine whether decoder 200 has converged on a valid codeword (i.e., a codeword that may be generated using H-matrix 100). Decision 304 may be performed by, for example, a syndrome check calculator (not shown). The syndrome check calculator (i) receives a 720-element vector $\hat{x}^{(i)}$ formed from 720 hard-decision bits $\hat{x}_n^{(i)}$ output from VNUs 206(0)-(71) during ten clock cycles, and (ii) multiplies the 720-element vector $\hat{x}_n^{(i)}$ by the transpose $H^T$ of H-matrix 100 of FIG. 1 to generate a 288-bit vector, where each bit of the 288-bit vector corresponds to one of the 288 check nodes (i.e., rows) of H-matrix 100. Note that, the syndrome check calculator may be performed in block-serial fashion (i.e., the syndrome check may be updated as hard-decision bits $\hat{x}_n^{(i)}$ become available).

If each element of the resulting 288-bit vector is equal to zero (i.e., $\hat{x}H^T = 0$), then LDPC decoder 200 has converged on a valid codeword, and a cyclic-redundancy check (CRC) 306 may be performed by, for example, controller 216 to determine whether the valid codeword is the correct codeword (i.e., the codeword that was transmitted). Typically a number r of CRC bits are appended to the user data at the transmitter before LDPC encoding such that, upon decoding, the 720-element vector $\hat{x}^{(i)}$ output from VNUs 206(0)-(71) comprises (i) the user data transmitted by the transmitter and (ii) the r CRC bits. To perform the CRC check, the user data may be divided by a keyword that is known a priori by the receiver, and the remainder of the division process may be compared to the r CRC bits. If the remainder is equal to the r CRC bits, then the CRC check has passed, indicating that LDPC decoder 200 has converged on the correct codeword. In such a case, decoding for the subject codeword is stopped. If the remainder is not equal to the r CRC bits, then the CRC check has failed, indicating that LDPC decoder 200 has not converged on the correct codeword. In such a case, further actions 308 may be performed to recover the correct LDPC-encoded codeword. Such further actions may include, for example, a retransmission of the data or performance of one or more global iterations of a turbo decoder in which LDPC decoder 200 resides. A global iteration may include, for example, channel detection, interleaving, de-interleaving, and LDPC decoding.

Returning to decision 304, if one or more elements of the resulting 288-bit vector are equal to one (i.e., $\hat{x}H^T \neq 0$), then LDPC decoder 200 has not converged on a valid codeword. Each element of the 288-bit vector that has a value of one is considered an unsatisfied check node (USC), and each element of the 288-bit vector that has a value of zero is either (i) a satisfied check node or (ii) a missatisfied check node (MSC) (i.e., a check node that falsely shows as satisfied). If LDPC decoder 200 has not converged on a valid codeword, then controller 216 determines whether or not to continue decoding in the non-averaging mode (decision 310).

Decision 310 may involve performing one or more suitable methods. According to a first method, controller 216 may determine whether a trapping set has been encountered. Determining whether LDPC decoder 200 has encountered a trapping set may be performed using any suitable method. For example, the decoder could track the number ($b_{observed}$) of unsatisfied check nodes over several iterations. If, over several iterations, the number of unsatisfied check nodes is relatively stable, then this could be indicative of a trapping set. Determining whether the number of unsatisfied check nodes is relatively stable may be performed by tracking the variance of the number of unsatisfied check nodes over several iterations.

As yet another example of this first method, LDPC decoder 200 could determine whether (i) the vector resulting from $\hat{x}H^T$ possesses a number ($b_{observed}$) of unsatisfied check nodes that is greater than zero and less than a specified number ($b_{max}$) of unsatisfied check nodes (e.g., 16) and (ii) the particular configuration of unsatisfied check nodes has remained relatively stable (i.e., the number and locations of the unsatisfied check nodes have not changed) for several local iterations of LDPC decoder 200 (e.g., two or three iterations). If, over several iterations, the number and configuration of unsatisfied check nodes are relatively stable, then this could be indicative of a trapping set. As even yet another example of this first method, LDPC decoder 200 could just consider whether the configuration of unsatisfied check nodes has remained relatively stable.

According to a second method, controller 216 may compare the number of local iterations performed by LDPC decoder 200 to a specified number of iterations (i.e., an iteration threshold). Note that this method could be used in conjunction with the above-mentioned method for determining whether a trapping set has been encountered. For example, LDPC decoder 200 could continue decoding as long as (i) a trapping set has not been encountered, and (ii) LDPC decoder 200 has not performed the specified number of iterations. If either (i) a trapping set is encountered, or (ii) LDPC decoder 200 has performed the specified number of iterations, then decoding in the non-averaging mode is discontinued. The first method may be advantageous when LDPC decoder 200 converges on a trapping set before the specified number of iterations has been reached. By identifying a trapping set before the specified number of iterations, the decoder can avoid performing unnecessary iterations. The second method may be advantageous when the number and/or configuration of trapping sets do not stabilize after a specified number of iterations. This may prevent LDPC decoder 200 from running for extended periods of time, resulting in increased latency of LDPC decoder 200.

If controller 216 determines that LDPC decoder 200 has not (i) reached the specified iteration threshold or (ii) converged on a trapping set, then processing returns to action 302 to perform another decoding iteration. If, on the other hand, controller 216 determines that LDPC decoder 200 has either (i) reached the specified iteration threshold or (ii) converged on a trapping set, then controller 216 performs decision 312 to determine whether or not to perform decoding in the averaging mode. Decision 312 may be performed by, for example, determining whether the number ($b_{observed}$) of unsatisfied check nodes exceeds a specified number ($b_{max}$) of unsatisfied check nodes (e.g., 16). If the number ($b_{observed}$) of unsatisfied check nodes exceeds a specified number ($b_{max}$) of unsatisfied check nodes, then it is likely that LDPC decoder 200 has experienced an error in the communication channel. In such a case, averaged decoding is not performed. Rather, further actions 326 may be performed to recover the correct LDPC-encoded codeword, such as retransmission of the data or performance of one or more global iterations of the turbo decoder.

If the number ($b_{observed}$) of unsatisfied check nodes is less than or equal to the specified number ($b_{max}$) of unsatisfied check nodes, then it is likely that LDPC decoder 200 has converged on a trapping set. In such a case, controller 216 initiates decoding in the averaging mode (decision 312) to increase the likelihood of breaking the trapping set. Upon initiating the averaging mode, LDPC decoder 200 is restarted (action 314) using the initial channel LLR values $La_n^{(0)}$. LDPC decoder 200 then performs the first x iterations without averaging (action 316) as described above, where x is determined experimentally (e.g., x=0, 1, or 2). After the first x iterations, averaged decoding is performed (action 318). In averaging mode, multiplexers 208(0)-(3), cyclic shifters 210 (0)-(3), CNUs 212(0)-(287), and cyclic shifters 214(0)-(3) operate in the manner described above. Each VNU 206, however, is reconfigured to generate an average extrinsic LLR value $Le_{n,avg}^{(i)}$ for each variable node (i.e., column) of H-matrix 100 processed as shown in Equation (9) below:

$$Le_{n,avg}^{(i)} = \frac{(Le_n^{(i)} + Le_{n,avg}^{(i-1)})}{2} \quad (9)$$

where $Le_{n,avg}^{(i-1)}$ is the previous, average extrinsic LLR value for the $(i-1)^{th}$ iteration. Note that, during the first averaging iteration, an average extrinsic LLR value $Le_{n,avg}^{(i-1)}$ is not yet generated. Therefore, during the first averaging iteration, the previously generated non-averaged extrinsic LLR value $Le_n^{(i-1)}$ is used in lieu of the average extrinsic LLR value $Le_{n,avg}^{(i-1)}$ for the previous iteration in Equation (9).

In addition to generating an average extrinsic LLR value $Le_{n,avg}$, each VNU 206 updates the $P_n^{(i)}$ value, the hard decision-bit $\hat{x}_n^{(i)}$, and each of the four Q messages that it generates, where each is updated based on the average extrinsic LLR value $Le_{n,avg}^{(i)}$. Each $P_n^{(i)}$ message is updated using Equation (10) as follows:

$$P_n^{(i)} = La_n^{(0)} + Le_{n,avg}^{(i)} \quad (10)$$

and each hard-decision bit $\hat{x}_n^{(i)}$ may be represented as shown in Equations (7) and (8) above. Each Q message is updated as shown in Equation (11):

$$Q_{nm}^{(i)} = La_n^{(0)} + Le_{n,avg}^{(i)} - R_{mn}^{(i)} = P_n^{(i)} - R_{mn}^{(i)} \quad (11)$$

After performing an iteration of averaged decoding, decision 320 is performed to determine whether decoder 200 has converged on a valid codeword (i.e., a codeword that may be generated using H-matrix 100). Decision 320 may be performed by, for example, a syndrome check calculator (not shown) in a manner similar to that described above in relation to decision 304. If decoder 200 has converged on a valid codeword, then CRC check 322 may be performed in a manner similar to that described above in relation to CRC check 306 to determine whether the valid codeword is the correct codeword. If decoder 200 has not converged on a valid codeword, then controller 216 performs decision 324 to determine whether or not to continue averaged decoding. Decision 324 may be performed in a manner similar to that of decision 310 (e.g., by checking the number of iterations performed, the number of unsatisfied check nodes, and/or the configuration of unsatisfied check nodes). If controller 216 determines that averaged decoding should be continued, then processing returns to action 318 to perform another averaged decoding iteration. If controller 216 determines that averaged decoding should be discontinued, then further actions 326 may be performed such as a retransmission of the data or performance of one or more global iterations of a turbo decoder in which LDPC decoder 200 resides.

Figure 4:
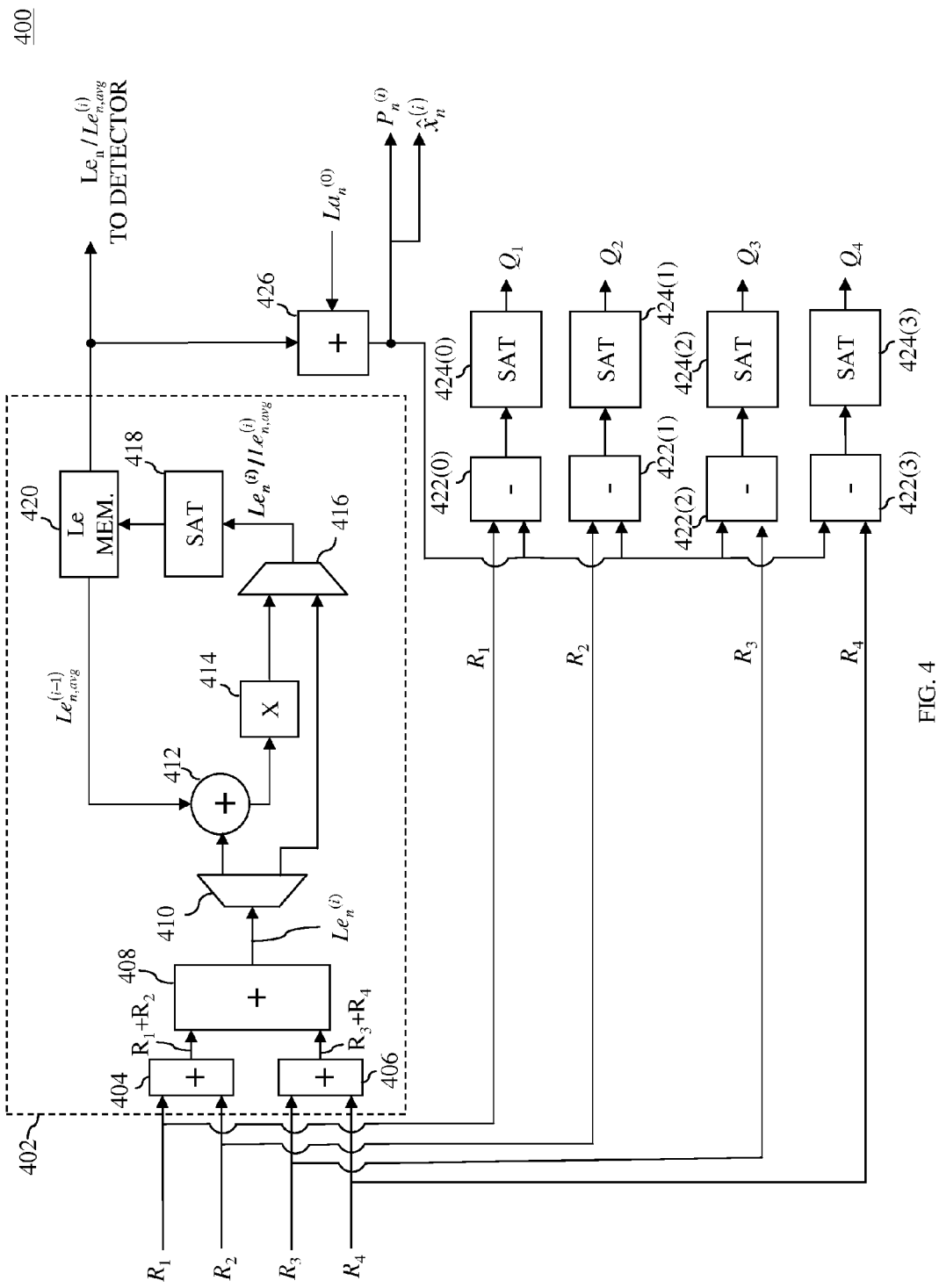
FIG. 4 shows a simplified block diagram of a variable-node unit (VNU) according to one embodiment of the present invention that may be used to implement each VNU of FIG. 2.

FIG. 4 shows a simplified block diagram of a VNU 400 according to one embodiment of the present invention that may be used to implement each VNU 206 of FIG. 2. VNU 400 has extrinsic LLR value generator 402, which is selectively operable in either (i) the non-averaging mode to generate a non-averaged extrinsic LLR value $Le_n^{(i)}$ corresponding to each bit n of the LDPC-encoded codeword processed by VNU 400, or (ii) the averaging mode to generate an average extrinsic LLR value $Le_{n,avg}^{(i)}$ corresponding to each bit n of the LDPC-encoded codeword processed.

In the non-averaging mode, VNU 400 receives, for each the ten variable nodes (i.e., columns) of H-matrix 100 associated with VNU 400, four R messages $R_1$, $R_2$, $R_3$, and $R_4$, and a channel LLR value $La_n^{(0)}$ per iteration corresponding to a bit n of the LDPC-encoded codeword. Extrinsic LLR value generator 402 adds the four R messages together to generate the extrinsic LLR value $Le_n^{(i)}$ as shown in Equation (5) using two adder stages. The first adder stage comprises (i) adder 404, which adds messages $R_1$ and $R_2$ (i.e., $R_1+R_2$), and (ii) adder 406, which adds messages $R_3$ and $R_4$ (i.e., $R_3+R_4$). The second adder stage comprises adder 408, which adds (i) the sum of messages $R_1$ and $R_2$ to (ii) the sum of messages $R_3$ and $R_4$ to generate the extrinsic LLR value $Le_n^{(i)}$ (i.e., $Le_n^{(i)} = R_1 + R_2 + R_3 + R_4$). The extrinsic LLR value $Le_n^{(i)}$ is then provided to demultiplexer 410, which, in the non-averaging mode, outputs the extrinsic LLR value $Le_n^{(i)}$ via the lower output of demultiplexer 410 to multiplexer 416. The extrinsic LLR value $Le_n^{(i)}$ is then output from multiplexer 416 and saturated by saturation block 418. Saturation may be performed such that the extrinsic LLR value $Le_n^{(i)}$ is maintained within a specified range. For example, if a range of ±15 is specified, an extrinsic LLR value $Le_n^{(i)}$ greater than ±15 may be mapped to +15 and an extrinsic LLR value $Le_n^{(i)}$ less than −15 may be mapped to −15. Note that truncation (i.e., dropping one or more least-significant bits) may be performed in lieu of, or in addition to, saturation block 418 to generate extrinsic LLR values having an appropriate number of bits for use by a downstream channel detector.

The saturated extrinsic LLR value $Le_n^{(i)}$ is stored in Le memory 420, which may be implemented as a single buffer shared by all 72 VNUs 206 that stores extrinsic LLR values $Le_n^{(i)}$ corresponding to all 720 bits n of the LDPC-encoded codeword, or as 72 buffers, one buffer for each VNU 206, where each buffer stores ten extrinsic LLR values $Le_n^{(i)}$, one for each variable node (i.e., column) of H-matrix 100 processed. After storage, the saturated extrinsic LLR value $Le_n^{(i)}$ is output to (i) downstream processing, such as a channel detector which may use the extrinsic LLR value $Le_n^{(i)}$ to improve channel detection, and (ii) adder 426. Adder 426 adds the channel LLR value $La_n^{(0)}$ to the saturated extrinsic LLR value $Le_n^{(i)}$ to generate a $P_n^{(i)}$ value as shown in Equation (6). The $P_n^{(i)}$ value is provided to adders 422(0)-(3) and is output from VNU 400. Further, a most-significant bit of the $P_n^{(i)}$ value is output as a hard-decision value $\hat{x}_n^{(i)}$, represented as shown in Equations (7) and (8).

Each adder 422 generates a Q message as shown in Equation (4) based on (i) the R message that it receives and (ii) the $P_n^{(i)}$ value generated by adder 426. In particular, message $Q_1$ is generated by subtracting message $R_1$ from $P_n^{(i)}$ (i.e., $Q_1=R_1+R_2+R_3+R_4+La_n^{(i)}-R_1$), message $Q_2$ is generated by subtracting message $R_2$ from $P_n^{(i)}$ (i.e., $Q_2=R_1+R_2+R_3+R_4+La_n^{(i)}-R_2$), message $Q_3$ is generated by subtracting message $R_3$ from $P_n^{(i)}$ (i.e., $Q_3=R_1+R_2+R_3+R_4+La_n^{(i)}-R_3$), and message $Q_4$ is generated by subtracting message $R_4$ from $P_n^{(i)}$ (i.e., $Q_4=R_1+R_2+R_3+R_4+La_n^{(i)}-R_4$). Messages $Q_1$, $Q_2$, $Q_3$, and $Q_4$ may then be saturated by saturation blocks 424(0)-(3) in a manner similar to that described above in relation to saturation block 418 and output to downstream processing such as multiplexers 208(0)-(3) of FIG. 2. Note that truncation may be performed in lieu of, or in addition to, saturation blocks 424(0)-(3).

In the averaging mode, adders 404, 406, and 408 of extrinsic LLR generator 402 sum the four R messages $R_1$, $R_2$, $R_3$, and $R_4$ as described above in relation to the non-averaging mode to generate an extrinsic LLR value $Le_n^{(i)}$ as shown in Equation (5). The extrinsic LLR value $Le_n^{(i)}$ is provided to demultiplexer 410, which, in the averaging mode, outputs the extrinsic LLR value $Le_n^{(i)}$ via the upper output of demultiplexer 410 to adder 412. Adder 412 adds the extrinsic LLR value $Le_n^{(i)}$ to an average extrinsic LLR value $Le_{n,avg}^{(i-1)}$ for the $(i-1)^{th}$ iteration, and multiplier 414 divides the resulting sum by 2 as shown in Equation (9) to generate an average extrinsic LLR value $Le_{n,avg}^{(i)}$ for the current iteration. Note that, as used in this specification, the term "multiplier" refers to a component that performs an operation equivalent to multiplication. For example, the averaging performed in Equation (9) may be performed by (i) dividing the output of adder 412 by 2, (ii) multiplying the output of adder 412 by the multiplicative inverse of 2 (i.e., 0.5), or (iii) performing a right-shift operation on the output of adder 412 to obtain a value equivalent to dividing the output of adder 412 by 2.

The average extrinsic LLR value $Le_{n,avg}^{(i)}$ is saturated by saturation block 418, stored in Le memory 420, and subsequently output to (i) downstream processing, such as a channel detector, and (ii) adder 426. Adder 426 adds the channel LLR value $La_n^{(0)}$ to the saturated, average extrinsic LLR value $Le_{n,avg}^{(i)}$ to generate the $P_n^{(i)}$ value as shown in Equation (10). The $P_n^{(i)}$ value is provided to adders 422(0)-(3) and is output from VNU 400. Further, a most-significant bit of the $P_n^{(i)}$ value is output as a hard-decision value $\hat{x}_n^{(i)}$, which may be represented as shown in Equations (7) and (8). Each adder 422 generates a Q message in a manner similar to that described above in relation to the non-averaging mode. However, as shown in Equation (11), each of the Q messages is based on the average extrinsic LLR value $Le_{n,avg}^{(i)}$ generated by adder 426 rather than a non-averaged extrinsic LLR value $Le_n^{(i)}$.

Layered LDPC Decoding

Figure 5:
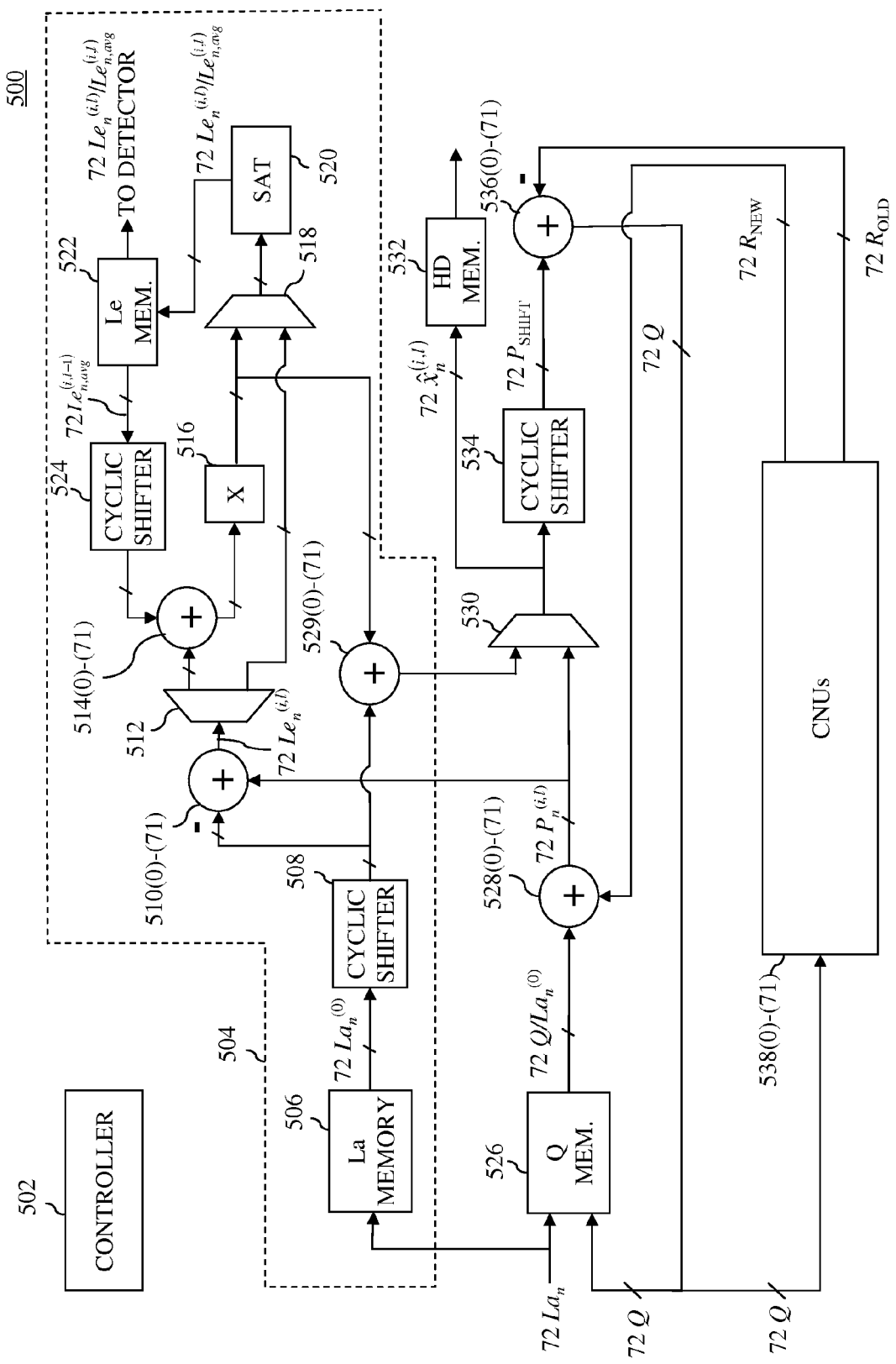
FIG. 5 shows a simplified block diagram of a layered LDPC decoder according to one embodiment of the present invention.

FIG. 5 shows a simplified block diagram of a layered LDPC decoder 500 according to one embodiment of the present invention. LDPC decoder 500, which may be used to recover codewords encoded using an H-matrix such as H-matrix 100 of FIG. 1, receives 720 channel LLR values $La_n^{(0)}$ for each codeword received from an upstream processor, where each channel LLR value $La_n^{(0)}$ corresponds to one bit of the codeword. For this discussion, it will again be assumed that each channel LLR values $La_n^{(0)}$ has five bits, including one hard-decision bit and a four-bit confidence value. LDPC decoder 500 has extrinsic LLR value generator 504, which is selectively operable in either a non-averaging mode or an averaging mode. Initially, LDPC decoder 500 attempts to recover each LDPC-encoded codeword by operating LLR value generator 504 in the non-averaging mode. If LDPC decoder 500 fails to correctly recover an LDPC-encoded codeword, then LLR value generator 504 is operated in the averaging mode to recover the LDPC-encoded codeword, where extrinsic messages $Le_n^{(i)}$ are averaged over one or more iterations of LDPC decoder 500.

In general, LDPC decoder 500 iteratively decodes the 720 channel LLR values $La_n^{(0)}$ (i.e., messages) using a block-serial message-passing schedule. LDPC decoder 500 updates the messages of H-matrix 100 one layer at a time, where each block row of H-matrix 100 may be considered a layer. Each pass of LDPC decoder 500 is considered a sub-iteration, and each full iteration comprises four sub-iterations, one for each layer. During the first sub-iteration LDPC decoder 500 updates the check-node (i.e., row) messages for the first layer (i.e., circulants $B_{1,1}$, $B_{1,2}$, ..., $B_{1,10}$). During the second sub-iteration, the updated check-node messages for the first layer are used to update the variable-node (i.e., column) messages for the first layer, and the resulting updated variable-node messages for the first layer are used to update the check-node (i.e., row) messages for the second layer (i.e., circulants $B_{2,1}$, $B_{2,2}$, ..., $B_{2,10}$). During the third sub-iteration, the updated check-node messages for the second layer are used to update the variable-node (i.e., column) messages for the second layer, and the resulting updated variable-node messages for the second layer are used to update the check-node (i.e., row) messages for the third layer (i.e., circulants $B_{3,1}$, $B_{3,2}$, ..., $B_{3,10}$). During the fourth sub-iteration, the updated check-node messages for the third layer are used to update the variable-node (i.e., column) messages for the third layer, and the updated variable-node messages for the third layer are used to update the check-node (i.e., row) messages for the fourth layer (i.e., circulants $B_{3,1}$, $B_{3,2}$, ..., $B_{3,10}$). At the end of the fourth sub-iteration, a full iteration is complete, and this process may be repeated for subsequent sub-iterations. Note that, during the during the first sub-iteration of the next iteration, the updated check-node messages for the fourth layer are used to update the variable-node (i.e., column) messages for the fourth layer, and the resulting updated variable-node messages for the fourth layer are used to update the check-node (i.e., row) messages for the first layer.

In the non-averaging mode, during the first sub-iteration, the 720 channel LLR values $La_n^{(0)}$ are provided at a rate of 72 channel LLR values $La_n^{(0)}$ per clock cycle to Q memory 526 and La memory 506. After storing the 720 channel LLR values $La_n^{(0)}$, Q memory 526 provides the channel LLR values $La_n^{(0)}$ to adders 528(0)-(71) at a rate of 72 channel LLR values $La_n^{(0)}$ per clock cycle such that each adder 528 receives a different channel LLR value $La_n^{(0)}$ in each set of 72 channel LLR values $La_n^{(0)}$. The channel LLR values $La_n^{(0)}$ may be output from Q memory 526 in an order that is different from the order in which they were received, and the order in which the channel LLR values $La_n^{(0)}$ are output may be controlled by, for example, controller 502. During subsequent sub-iterations, Q memory 526 provides 720 variable-node messages (i.e., Q messages) received from adders 536(0)-(71) to adders 528(0)-(71) at a rate of 72 Q messages per clock cycle. The Q messages are generated during the previous sub-iteration, and similar to the channel LLR values $La_n^{(0)}$, the Q messages may be output in an order that is different from the order in which they were received. For the following discussion, it will be understood that any reference to Q messages, applies to channel LLR values $La_n^{(0)}$ during the first sub-iteration of LDPC decoder 500.

During each sub-iteration, each adder 528 receives a number of Q messages equal to the hamming weight $w_r$ of a row of H-matrix 100 (e.g., 10) at a rate of one Q message per clock cycle. For each Q message received, the adder 528 generates a $P_n^{(i,l)}$ message by adding the Q message that it receives to a new check-node message $R_{NEW}$ as shown below in Equation (12):

$$P_n^{(i,l)} = Q_{nm}^{(i,l)} + R_{mn}^{(i,l)} \quad (12)$$

where (i) $P_n^{(i,l)}$ represents the P message corresponding to the $n^{th}$ variable node (i.e., column) of H-matrix 100 of FIG. 1 for the $i^{th}$ iteration and $l^{th}$ sub-iteration, (ii) $R_{mn}^{(i,l)}$ represents a new check-node message $R_{NEW}$ corresponding to the $m^{th}$ check node (i.e., row) and the $n^{th}$ variable node of H-matrix 100, and (iii) $Q_{nm}^{(i,l)}$ represents the Q message corresponding to the $n^{th}$ variable node and the $m^{th}$ check node of H-matrix 100. Note that, for the first sub-iteration l=1 of the first iteration i=1, $Q_{nm} = La_n^{(0)}$ and each $R_{NEW}$ message may be initialized to zero (i.e., $R_{mn}^{(0,0)}$ such that $P_n^{(i,l)} = L_n^{(0)}$).

Adders 528(0)-(71) output sets of 72 $P_n^{(i,l)}$ messages to the bottom input of multiplexer 530, which, in the non-averaging mode, outputs (i) each set of 72 $P_n^{(i,l)}$ messages to cyclic shifter 534 and (ii) 72 hard-decision bits $\hat{x}_n^{(i,l)}$ to hard-decision (HD) memory 532. Each hard-decision bit $\hat{x}_n^{(i,l)}$, which may be represented as shown in Equations (7) and (8) above, is determined by taking the most-significant bit (MSB) of a corresponding one of the $P_n^{(i,l)}$ messages. HD memory 532 stores the hard-decision bits $\hat{x}_n^{(i,l)}$ and outputs the bits to, for example, a syndrome checker (not shown) which performs a syndrome check in a manner similar to that described above in relation to LDPC decoder 200 of FIG. 2. The syndrome check may be performed every time a layer of H-matrix 100 is processed by LDPC decoder 500 (e.g., every sub-iteration).

Cyclic shifter 534 cyclically shifts each set of 72 $P_n^{(i,l)}$ messages based on a cyclic-shift signal that may be received from, for example, controller 502. The cyclic-shift signal corresponds to cyclic-shift factors of the circulants of H-matrix 100 of FIG. 1. Cyclic shifter 534 then provides the sets of 72 cyclically-shifted P messages $P_{SHIFT}$ to adders 536(0)-(71), such that each adder 536 receives a different one of the shifted P messages $P_{SHIFT}$ in each set of 72 cyclically-shifted P messages P $P_{SHIFT}$.

Each adder 536, which for purposes of this application will also be known as a variable-node unit, receives a number of cyclically shifted P messages $P_{SHIFT}$ equal to the hamming weight $w_r$ of a row of H-matrix 100 (e.g., 10) at a rate of one $P_{SHIFT}$ message per clock cycle. For each $P_{SHIFT}$ message received, the adder 536 updates a Q message by subtracting an old check-node message $R_{OLD}$ from the $P_{SHIFT}$ message as shown in Equation (13) below:

$$Q_{nm}^{(i,l)} = P_n^{s(i,l)} - R_{mn}^{(i-1,l)} \quad (13)$$

where (i) $P_n^{s(i,l)}$ represents the cyclically-shifted P message $P_{SHIFT}$ and (ii) $R_{mn}^{(i-1,l)}$ represents the $R_{OLD}$ message, which may be initialized to zero for the first sub-iteration l=0 of the first iteration i=0. The updated Q messages are fed (i) back to Q memory 526 for use in processing the next layer of H-matrix 100 and (ii) to check-node units (CNUs) 538(0)-(71).

During each sub-iteration, each CNU 538 (i) receives a number of Q messages equal to the hamming weight $w_r$ of a row of H-matrix 100 (e.g., 10) at a rate of one Q message per clock cycle and (ii) generates $w_r$ R messages using a suitable check-node algorithm such as the min-sum algorithm shown in Equations (1) to (3) above. Each R message generated by the CNU 538 is used by LDPC decoder 500 during two successive iterations. Each R message that is output during the current iteration is shown as $R_{NEW}$ and each R message that is output during the subsequent iteration is shown as $R_{OLD}$. During the current iteration, each $R_{NEW}$ message is used to update a $P_n^{(i,l)}$ message as described above in relation to Equation (12), and during the subsequent iteration, each $R_{OLD}$ message is used to update a Q message as described above in relation to Equation (13). A more-detailed discussion of CNUs that may be used to implement CNUs 538 may be found in U.S. patent application Ser. No. 12/475,786 filed on Jun. 1, 2009, the teachings of which are incorporated herein by reference in their entirety.

To generate extrinsic LLR values $Le_n^{(i,l)}$ in the non-averaging mode, La memory 506 of extrinsic LLR generator 504 provides the 720 channel LLR values $La_n^{(0)}$ to cyclic shifter 508 at a rate of 72 channel LLR values $La_n^{(0)}$ per clock cycle. Cyclic shifter 508 shifts each set of 72 channel LLR values $La_n^{(0)}$ such that each LLR value $La_n^{(0)}$ is provided to an adder 510 along with a $P_n^{(i,l)}$ value that corresponds to the same bit n of the LDPC-encoded codeword. For each channel LLR value $La_n^{(0)}$ and corresponding $P_n^{(i,l)}$ value received, each adder 510 subtracts the channel LLR value $La_n^{(0)}$ from the corresponding $P_n^{(i,l)}$ value to generate an extrinsic LLR value $Le_n^{(i,l)}$ as follows:

$$Le_n^{(i,l)} = P_n^{(i,l)} - La_n^{(0)} = Q_{nm}^{(i,l)} + R_{mn}^{(i,l)} - La_n^{(0)} \quad (14)$$

Note that the extrinsic LLR values $Le_n^{(i,l)}$ are updated once every sub-iteration l and four times every iteration i. In layered decoder 500, each extrinsic LLR value $Le_n^{(i,l)}$ generated for an iteration i (i.e., every four sub-iterations) is a function of four R messages. This is similar to non-layered decoder 200, which, for each bit n of the LDPC-encoded codeword, (i) generates four R messages per iteration, and (ii) sums the four R messages to generate an extrinsic LLR value $Le_n^{(i)}$. However, since layered decoder 500 only updates one of the four R messages every sub-iteration, each extrinsic LLR value $Le_n^{(i,l)}$ generated for a sub-iteration may be a function of less than four R messages.

Further, note that, after a first sub-iteration j of iteration i of layered decoder 500, the updating of an R message is affected by the corresponding R messages updated during previous sub-iterations j of the same iteration i. For example, an R message updated during a fourth sub-iteration j of iteration i is affected by three corresponding R messages generated during the first through third sub-iterations j of iteration i. In non-layered decoder 200, on the other hand, the four R messages are typically generated concurrently during the same iteration, and thus, each R message is not affected by the other three corresponding R messages. As a result, the extrinsic LLR values $Le_n^{(i,l)}$ generated for an iteration of layered decoder 500 might not be the same as the extrinsic LLR values $Le_n^{(i,l)}$ generated for an analogous iteration of non-layered decoder 200.

The extrinsic LLR values $Le_n^{(i,l)}$ may be saturated by saturation block 520, which may perform operations similar to those of saturation block 418 of FIG. 4. The saturated extrinsic LLR values $Le_n^{(i,l)}$ are then stored in Le memory 522 and output to downstream processing (not shown) such as a channel detector. The saturated extrinsic LLR values $Le_n^{(i,l)}$ may be used by the channel detector to improve channel detection. To further understand the operation of LDPC decoder 500, consider flow diagram 600 of FIG. 6.

Figure 6:
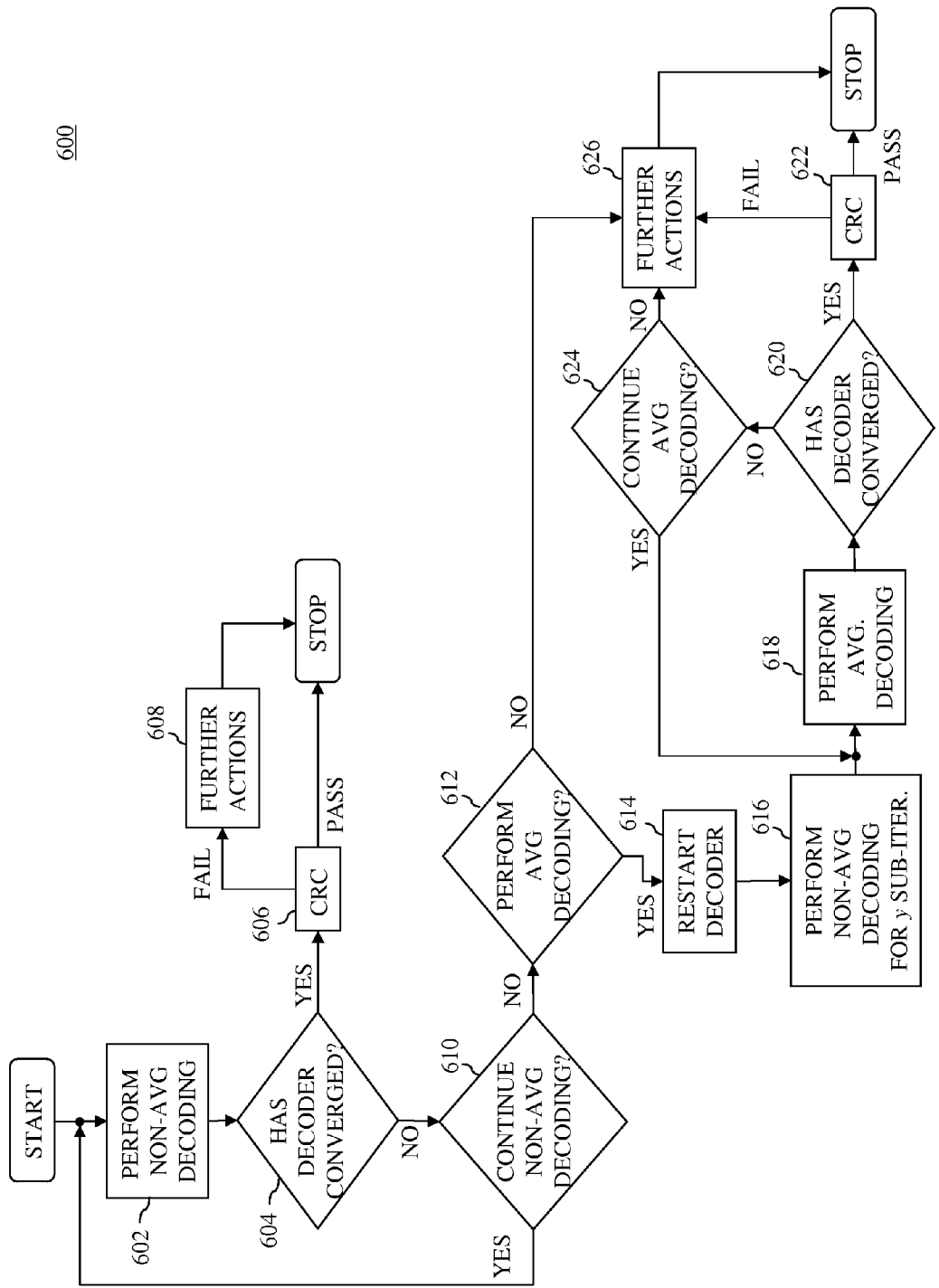
FIG. 6 shows a simplified flow diagram of processing performed by an LDPC decoder such as the LDPC decoder of FIG. 5 according to one embodiment of the present invention.

FIG. 6 shows a simplified flow diagram 600 of processing performed by an LDPC decoder such as LDPC decoder 500 according to one embodiment of the present invention. After startup, LDPC decoder 500 performs an initial decoding sub-iteration (action 602) in the non-averaging mode as described above in relation to FIG. 5. Next, decision 604 is performed to determine whether decoder 500 has converged on a valid codeword (i.e., a codeword that may be generated using H-matrix 100). Decision 604 may be performed by, for example, a syndrome check calculator (not shown) as described above in relation to decision 304 of FIG. 3. However, rather than waiting for a full iteration to be complete, decision 604 may be performed after each sub-iteration of decoder 500 because each sub-iteration updates the 720 $P_n^{(i,l)}$ values.

If LDPC decoder 500 has converged on a valid codeword, then a cyclic-redundancy check (CRC) 606 may be performed by, for example, controller 502 in a manner similar to that described above in relation to CRC 306 of FIG. 3 to determine whether the valid codeword is the correct codeword (i.e., the codeword that was transmitted). If the CRC has passes, indicating that LDPC decoder 500 has converged on the correct codeword, then decoding for the subject codeword is stopped. If the CRC fails, indicating that LDPC decoder 500 has not converged on the correct codeword, then further actions 608, such as a retransmission of the data or performance of one or more global iterations of a turbo decoder in which LDPC decoder 500 resides, may be performed to recover the correct LDPC-encoded codeword.

If LDPC decoder 500 has not converged on a valid codeword (decision 604), then controller 216 determines whether or not to continue decoding in the non-averaging mode (decision 610). Decision 610 may be performed using one or more suitable methods as discussed above in relation to decision 310 of FIG. 3. If controller 502 determines that LDPC decoder 500 has either (i) reached the specified iteration threshold or (ii) converged on a trapping set, then controller 502 performs decision 612 to determine whether or not to perform decoding in the averaging mode. Decision 612 may be performed by, for example, determining whether the number ($b_{observed}$) of unsatisfied check nodes exceeds a specified number ($b_{max}$) of unsatisfied check nodes (e.g., 16). If the number ($b_{observed}$) of unsatisfied check nodes exceeds a specified number ($b_{max}$) of unsatisfied check nodes, then it is likely that LDPC decoder 500 has experienced an error in the communication channel. In such a case, averaged decoding is not performed. Rather, further actions 626 may be performed to recover the correct LDPC-encoded codeword, such as retransmission of the data or performance of one or more global iterations of the turbo decoder.

If the number ($b_{observed}$) of unsatisfied check nodes is less than or equal to the specified number ($b_{max}$) of unsatisfied check nodes, then it is likely that LDPC decoder 500 has converged on a trapping set. In such a case, controller 502 initiates decoding in the averaging mode (decision 612) to increase the likelihood of breaking the trapping set. Upon initiating the averaging mode, LDPC decoder 500 is restarted (action 614) using the initial channel LLR values $La_n^{(0)}$. LDPC decoder 500 then performs the first y sub-iterations without averaging (action 616) as described above in relation to FIG. 5, where y is determined experimentally (e.g., y=0, 1, or 2).

After the first y sub-iterations, averaged decoding is performed (action 618). In averaging mode, Q memory 526, adders 528(0)-(71), cyclic shifter 534, adders 536(0)-(71), and CNUs 538(0)-(71) operate in the manner described above in relation to the non-averaging mode. In addition, LDPC decoder 500 is reconfigured to generate average extrinsic LLR values $Le_{n,avg}^{(i,l)}$ as shown in Equation (15) below:

$$Le_{n,avg}^{(i,l)} = \frac{(P_n^{(i,l)} - La_n^{(0)} + Le_{n,avg}^{(i,l-1)})}{2} = \frac{Le_n^{(i,l)} + Le_{n,avg}^{(i,l-1)}}{2} \quad (15)$$

where $Le_{n,avg}^{(i,l-1)}$ is an average extrinsic LLR value for the $(l-1)^{th}$ sub-iteration of the $i^{th}$ iteration. Note that, during the first averaging sub-iteration, average extrinsic LLR values $Le_{n,avg}^{(i,l-1)}$ for the $(l-1)^{th}$ sub-iteration are not yet generated. Therefore, during the first averaging sub-iteration, the non-averaged extrinsic LLR value $Le_n^{(i,l-1)}$ for the $(l-1)^{th}$ sub-iteration is used in lieu of the average extrinsic LLR value $Le_{n,avg}^{(i,l-1)}$ for the $(l-1)^{th}$ sub-iteration in Equation (15).

To generate the average extrinsic LLR values $Le_{n,avg}^{(i,l)}$ extrinsic LLR generator 504 processes the 720 channel LLR values $La_n^{(0)}$ using La memory 506, cyclic shifter 508, and adders 510(0)-(71) as described above in relation to the non-averaging mode to generate non-averaged extrinsic LLR values $Le_n^{(i,l)}$. Adders 510 provide 72 non-averaged extrinsic LLR values $Le_n^{(i,l)}$ at a time via the upper output of multiplexer 512 to adders 514(0)-(71) such that each adder 514 receives a different one of the extrinsic LLR values $Le_n^{(i,l)}$. Cyclic shifter 524 receives 72 previously-generated, average extrinsic LLR values $Le_{n,avg}^{(i,l-1)}$ at a time from Le memory 522, and cyclically shifts the 72 previously-generated, average extrinsic LLR values $Le_{n,avg}^{(i,l-1)}$ such that each such that each is provided to the same adder 514 as an extrinsic LLR value $Le_n^{(i,l)}$ corresponding to the same bit n of the LDPC-encoded codeword. Each adder 514 adds the corresponding average extrinsic LLR value $Le_{n,avg}^{(i,l-1)}$ and extrinsic LLR value $Le_n^{(i,l)}$ that it receives as shown in Equation (15), and multiplier 516 divides each resulting sum by a value of 2 as shown in Equation (15) to generate an average extrinsic LLR value $Le_{n,avg}^{(i,l)}$ for the current sub-iteration. The current, average extrinsic LLR values $Le_{n,avg}^{(i,l)}$ are (i) provided 72 values at a time to the upper input of multiplexer 518, (ii) output by multiplexer 518 to saturation block 520, which saturates the current, average extrinsic LLR values $Le_{n,avg}^{(i,l)}$ in the same manner as described above in relation the non-averaging mode, and (iii) stored in Le memory 522, which stores all 720 current, average extrinsic LLR values $Le_{n,avg}^{(i,l)}$.

The current, average extrinsic LLR values $Le_{n,avg}^{(i,l)}$ are also provided 72 values at a time to adders 529(0)-(71), such that each adder receives a different one of the current, average extrinsic LLR values $Le_{n,avg}^{(i,l)}$. Each adder 529 adds the current, average extrinsic LLR values $Le_{n,avg}^{(i,l)}$ that it receives to a channel LLR value $La_n^{(0)}$ corresponding to the same bit n of the LDPC-encoded codeword to generate a $P_n^{(i,l)}$ message for the current sub-iteration l as follows:

$$P_n^{(i,l)} = La_n^{(0)} + Le_{n,avg}^{(i,l)} \quad (16)$$

The $P_n^{(i,I)}$ values are provided to the upper input of multiplexer 530, which outputs the $P_n^{(i,I)}$ values to cyclic shifter 534. The hard-decision bits $\hat{x}_n^{(i,I)}$ are generated in the same manner as described above in relation to the non-averaging mode and stored in HD memory 532.

After performing a sub-iteration of averaged decoding, decision 620 is performed to determine whether decoder 500 has converged on a valid codeword. Decision 620 may be performed by, for example, a syndrome check calculator (not shown) in a manner similar to that described above in relation to decision 604. If LDPC decoder 500 has converged on a valid codeword, then CRC 622 may be performed in a manner similar to that described above in relation to CRC check 606 to determine whether the valid codeword is the correct codeword. If LDPC decoder 500 has not converged on a valid codeword, then controller 502 performs decision 624 to determine whether or not to continue averaged decoding. Decision 624 may be performed in a manner similar to that of decision 610. If controller 502 determines that averaged decoding should be continued, then processing returns to action 618 to perform another averaged decoding sub-iteration. If controller 502 determines that averaged decoding should be discontinued, then further actions 626 may be performed such as a retransmission of the data, or performance of one or more global iterations of a turbo decoder in which LDPC decoder 500 resides.

Conclusion

By using extrinsic LLR message averaging, LDPC decoders of the present invention may reduce the occurrence of sudden changes in the magnitudes of the messages generated by the decoders compared to comparable LDPC decoders that do not implement averaging. Reducing such sudden changes may reduce the likelihood that the decoders will converge on a trapping set, and consequently, may improve the error-floor properties of the decoders.

Although embodiments of the present invention were described relative to averaging the current extrinsic message with the previous, average extrinsic message with equal weights (i.e., 0.5) to generate a current, average extrinsic message, the present invention is not so limited. For example, the current extrinsic message could be averaged with the previous, average extrinsic message with different weights (e.g., 0.75 for the current extrinsic message and 0.25 for the previous, average extrinsic message) to generate the current, average extrinsic message.

Alternatively, the current extrinsic message could be averaged (using various, different weighting schemes) with one or more (non-average) extrinsic messages retained from one or more previous iterations to generate the current, average extrinsic message. Since previous, average extrinsic messages are themselves functions of previous, non-average extrinsic messages, all current, average extrinsic messages may be said to be functions of the current, non-average extrinsic message and one or more previous, non-average extrinsic messages.

Although the present invention was described as performing an initial attempt to recover the correct codeword in a non-averaging mode, the present invention is not so limited. The present invention may perform the initial attempt to recover the correct codeword using averaging.

The present invention is also not limited to performing all non-averaging iterations (or sub-iterations) in succession and all averaging iterations (or sub-iterations) in succession. According to various embodiments, averaging iterations (or sub-iterations) may be interleaved with non-averaging iterations (or sub-iterations).

Further, although the present invention has been described relative to specific layered and non-layered LDPC decoder configurations, the present invention is not so limited. Various embodiments of the present invention may also be envisioned for other LDPC decoder structures that employ message passing. For example, the present invention may be implemented for other non-layered or for layered decoder structures, and decoders that use message-passing schedules other than a block-serial message-passing schedule. As another example, LDPC decoders of the present invention may be implemented without using cyclic shifters. In such embodiments, the messages may be passed between CNUs and VNUs through direct connections or using permutators that perform non-cyclic shifting.

According to various embodiments, the present invention may be implemented using check-node algorithms other than the offset min-sum algorithm. For example, such embodiments may use a scaled min-sum algorithm, or algorithms other than the min-sum algorithm, such as a sum-product algorithm (SPA) or the Bahl-Cocke-Jelinek-Raviv (BCJR) algorithm.

Although the present invention was described relative to the specific H-matrix 100 of FIG. 1, the present invention is not so limited. The present invention may be implemented for various H-matrices that are the same size as or a different size from matrix 100 of FIG. 1. For example, the present invention may be implemented for H-matrices in which the number of columns, block columns, rows, block rows, layers (including implementations having only one layer), messages processed per clock cycle, the size of the sub-matrices, the size of the layers, and/or the column and/or row hamming weights differ from that of H-matrix 100. Such H-matrices may be, for example, quasi-cyclic, non-cyclic, regular, or irregular H-matrices. H-matrices that are non-cyclic do not have any sub-matrices that are obtained by cyclically shifting an identity matrix. H-matrices that are irregular do not have the same hamming weight $w_r$ for all rows and/or the same hamming weight $w_c$ for all columns. Further, such H-matrices may comprise sub-matrices other than circulants including zero matrices. Note that the number of VNUs, cyclic shifters, and/or CNUs may vary according to the characteristics of the H-matrix.

It will be understood that the term "adder" as used in the specification refer to hardware that may perform addition or subtraction operations.

It will be further understood that various changes in the details, materials, and arrangements of the parts which have been described and illustrated in order to explain the nature of this invention may be made by those skilled in the art without departing from the scope of the invention as expressed in the following claims. For example, LDPC decoders of the present invention may process messages of sizes other than five bits. As another example, extrinsic LLR value generators of the present invention such as extrinsic LLR value generators 402 and 504 may perform truncation (i.e., dropping one or more least-significant bits) in lieu of, or in addition to, saturation blocks 418 and 520 to generate extrinsic LLR values having an appropriate number of bits for use by a downstream channel detector.

Although embodiments of the present invention have been described in the context of LDPC codes, the present invention is not so limited. Embodiments of the present invention could be implemented for any code that can be defined by a graph, e.g., tornado codes and structured irregular repeat-accumulate (IRA) codes, since graph-defined codes suffer from trapping sets.

The present invention is also not limited to receiving and processing log-likelihood ratios. Various embodiments of the present invention may be envisioned in which other soft values, such as likelihood ratios, or hard values such as hard decision bits are processed.

While the exemplary embodiments of the present invention have been described with respect to processes of circuits, including possible implementation as a single integrated circuit, a multi-chip module, a single card, or a multi-card circuit pack, the present invention is not so limited. As would be apparent to one skilled in the art, various functions of circuit elements may also be implemented as processing blocks in a software program. Such software may be employed in, for example, a digital signal processor, micro-controller, or general purpose computer.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing the invention. The present invention can also be embodied in the form of program code, for example, stored in a non-transitory machine-readable storage medium including being loaded into and/or executed by a machine, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

The present invention can also be embodied in the form of a bitstream or other sequence of signal values stored in a non-transitory recording medium generated using a method and/or an apparatus of the present invention.

Unless explicitly stated otherwise, each numerical value and range should be interpreted as being approximate as if the word "about" or "approximately" preceded the value of the value or range.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

We claim:

1. An apparatus comprising an error-correction decoder for recovering an error-correction-encoded codeword, the error-correction decoder comprising an extrinsic value generator adapted to:
   (a) generate a current extrinsic value based on at least one check-node value, wherein the current extrinsic value corresponds to a bit of the error-correction-encoded codeword; and
   (b) generate a current average extrinsic value based on the current extrinsic value and at least one previous extrinsic value, wherein the current average extrinsic value and the at least one previous extrinsic value correspond to the bit of the error-correction-encoded codeword.

2. The apparatus of claim 1, wherein the extrinsic value generator comprises:
   an adder that combines the current extrinsic value and the at least one previous extrinsic value to generate a sum; and
   a multiplier that generates the current average extrinsic value based on the sum.

3. The apparatus of claim 1, wherein the at least one previous extrinsic value is a previous average extrinsic value.

4. The apparatus of claim 1, wherein the current average extrinsic value is provided from the error-correction decoder to a channel detector for use in improving channel detection.

5. The apparatus of claim 1, wherein:
   the error-correction decoder is a non-layered error-correction decoder; and
   the current extrinsic value is generated by combining two or more check-node values.

6. The apparatus of claim 1, wherein:
   the error-correction decoder is a layered error-correction decoder; and
   the current extrinsic value is updated for each of a plurality of sub-iterations, where each sub-iteration corresponds to a layer of a parity-check matrix used to decode the error-correction-encoded codeword.

7. The apparatus of claim 6, wherein the error-correction decoder comprises:
   a variable node unit that generates a variable-node message corresponding to the bit of the error-correction-encoded codeword;
   a check-node unit that generates a check-node message corresponding to the bit of the error-correction-encoded codeword;
   an adder that adds the variable-node message to the check-node message to generate a P value; and
   an adder that subtracts a channel value corresponding to the bit of the error-correction-encoded codeword from the P value to generate the current extrinsic value.

8. The apparatus of claim 1, wherein the extrinsic value generator is selectively configurable to operate in either one of (i) a non-averaging mode in which the current average extrinsic value is not generated and (ii) an averaging mode in which the current average extrinsic value is generated; and
   the decoder further comprises a controller adapted to switch between the non-averaging mode and the averaging mode.

9. The apparatus of claim 8, wherein the controller is adapted to:
   (i) operate the extrinsic value generator in the non-averaging mode; and
   (ii) switch the extrinsic value generator to the averaging mode to generate the current average extrinsic value, if the error-correction decoder fails to recover the error-correction-encoded codeword in the non-averaging mode.

10. The apparatus of claim 8, wherein the controller is adapted to:
(i) operate the extrinsic value generator in the averaging mode;
(ii) determine a number of unsatisfied check nodes, if the error-correction decoder fails to recover the error-correction-encoded codeword in the non-averaging mode;
(iii) compare the number of unsatisfied check nodes to a specified threshold value; and
(iv) selectively switch, based on the comparison, the extrinsic value generator to the averaging mode to generate the current average extrinsic value.

11. The apparatus of claim 10, wherein the controller switches the extrinsic value generator to the averaging mode if the comparison determines that the number of unsatisfied check nodes is less than the specified threshold value.

12. The apparatus of claim 1, wherein the error-correction decoder is a low-density parity-check decoder.

13. An error-correction decoder implemented method for recovering an error-correction-encoded codeword, the method comprising:
(a) generating a current extrinsic value based on at least one check-node value, wherein the current extrinsic value corresponds to a bit of the error-correction-encoded codeword; and
(b) generating a current average extrinsic value based on the current extrinsic value and at least one previous extrinsic value wherein the current average extrinsic value and the at least one previous extrinsic value correspond to the bit of the error-correction-encoded codeword.

14. The method of claim 13, wherein step (b) comprises:
(b1) combining the current extrinsic value and the at least one previous extrinsic value to generate a sum; and
(b2) generating the current average extrinsic value based on the sum.

15. The method of claim 13, wherein the at least one previous extrinsic value is a previous average extrinsic value.

16. The method of claim 13, comprising step (c) providing the current average extrinsic value from the error-correction decoder to a channel detector for use in improving channel detection.

17. The method of claim 13, wherein:
the error-correction decoder performs non-layered error-correction decoding; and
step (a) comprises generating the current extrinsic value by combining two or more check-node values.

18. The method of claim 13, wherein:
the error-correction decoder performs layered error-correction decoding; and
the current extrinsic value is updated for each of a plurality of sub-iterations, where each sub-iteration corresponds to a layer of a parity-check matrix used to decode the error-correction-encoded codeword; and
the method comprises:
generating a variable-node message corresponding to the bit of the error-correction-encoded codeword;
generating a check-node message corresponding to the bit of the error-correction-encoded codeword;
adding the variable-node message to the check-node message to generate a P value; and
subtracting a channel value corresponding to the bit of the error-correction-encoded codeword from the P value to generate the current extrinsic value.

19. The method of claim 13, wherein the error-correction decoder is a low-density parity-check decoder.

20. An apparatus comprising an error-correction decoder for recovering an error-correction-encoded codeword, the apparatus comprising:
(a) means for generating a current extrinsic value based on at least one check-node value, wherein the current extrinsic value corresponds to a bit of the error-correction-encoded codeword; and
(b) means for generating a current average extrinsic value based on the current extrinsic value and at least one previous extrinsic value, wherein the current average extrinsic value and the at least one previous extrinsic value correspond to the bit of the error-correction-encoded codeword.

* * * * *